(12) United States Patent
Matsui

(10) Patent No.: US 7,193,308 B2
(45) Date of Patent: Mar. 20, 2007

(54) INTERMEDIATE CHIP MODULE, SEMICONDUCTOR DEVICE, CIRCUIT BOARD, AND ELECTRONIC DEVICE

(75) Inventor: Kuniyasu Matsui, Hotaka-machi (JP)

(73) Assignee: Seiko Epson Corporation (JP)

( * ) Notice: Subject to any disclaimer, the term of this patent is extended or adjusted under 35 U.S.C. 154(b) by 139 days.

(21) Appl. No.: 10/947,607

(22) Filed: Sep. 22, 2004

(65) Prior Publication Data

US 2005/0104219 A1 May 19, 2005

(30) Foreign Application Priority Data

Sep. 26, 2003 (JP) ............................. 2003-335675
Nov. 17, 2003 (JP) ............................. 2003-386512

(51) Int. Cl.
*H01L 23/02* (2006.01)
(52) U.S. Cl. ...................................... 257/686; 257/777
(58) Field of Classification Search ................ 257/777, 257/685, 686
See application file for complete search history.

(56) References Cited

U.S. PATENT DOCUMENTS

| | | | |
|---|---|---|---|
| 5,481,133 A * | 1/1996 | Hsu ............................. | 257/621 |
| 6,359,790 B1 | 3/2002 | Meyer-Berg | |
| 6,809,421 B1 * | 10/2004 | Hayasaka et al. ........... | 257/777 |
| 6,989,600 B2 * | 1/2006 | Kubo et al. .................. | 257/758 |
| 2003/0148558 A1 | 8/2003 | Kubo et al. | |

FOREIGN PATENT DOCUMENTS

| | | |
|---|---|---|
| JP | S60-79763 | 5/1985 |
| JP | 63-156348 | 6/1988 |
| JP | 2001-250836 | 9/2001 |
| JP | 2002-100727 | 4/2002 |
| JP | 2002-170919 | 6/2002 |
| JP | 2002-261232 | 9/2002 |
| JP | 2003-86733 | 3/2003 |
| JP | 2003-92375 | 3/2003 |
| WO | 01/82367 | 1/2001 |

OTHER PUBLICATIONS

Communication from Korean Patent Office re: related application.
Communication from Japanese Patent Office regarding corresponding application.
Communication from Chinese Patent Office re: related application.

* cited by examiner

*Primary Examiner*—Roy Potter
(74) *Attorney, Agent, or Firm*—Harness, Dickey & Pierce, P.L.C.

(57) ABSTRACT

An intermediate chip for electrically connecting semiconductor chips includes: a substrate having a first side and a second side; a trans-substrate conductive plug which projects to the first side of the substrate; a post electrode which is displaced from the trans-substrate conductive plug in plan view on the second side of the substrate; and wiring which is disposed in or on the substrate for coupling the trans-substrate conductive plug and the post electrode.

24 Claims, 20 Drawing Sheets

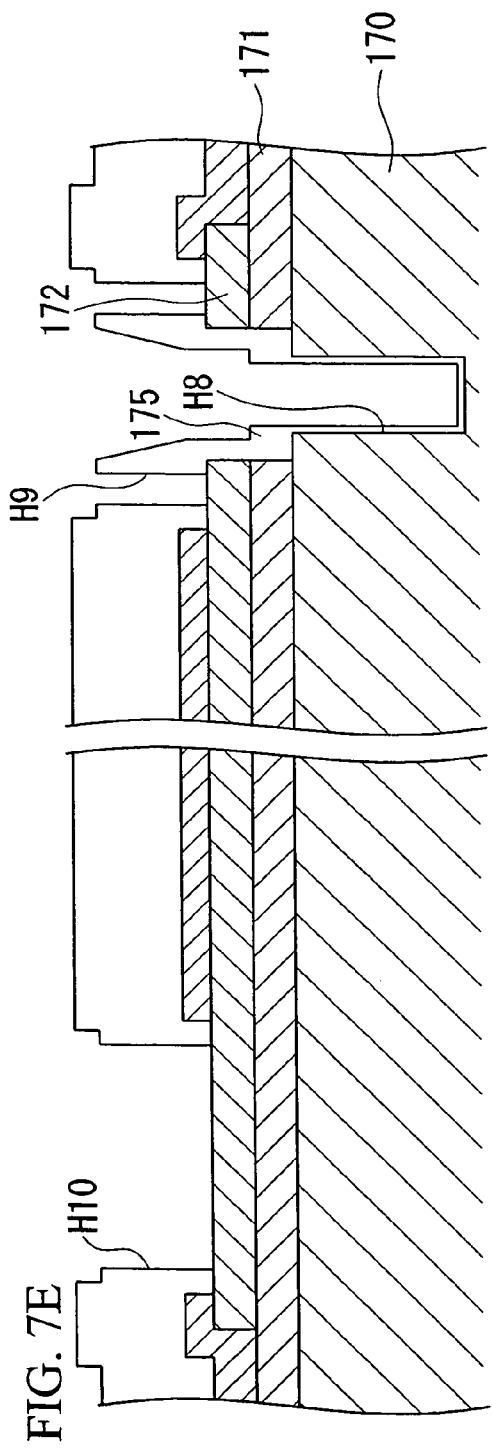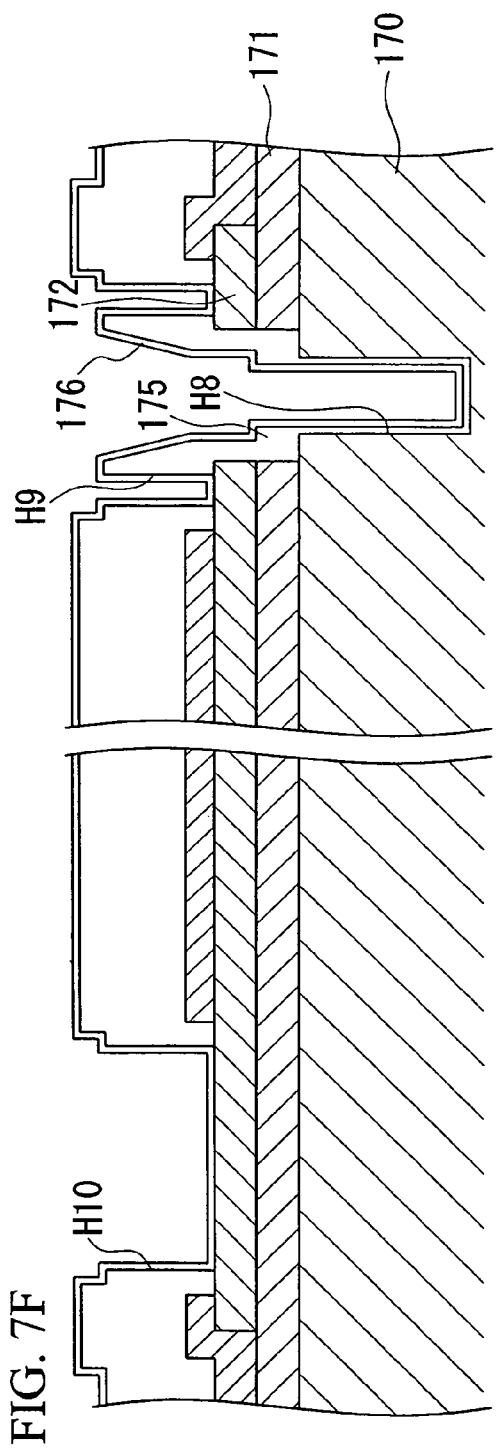

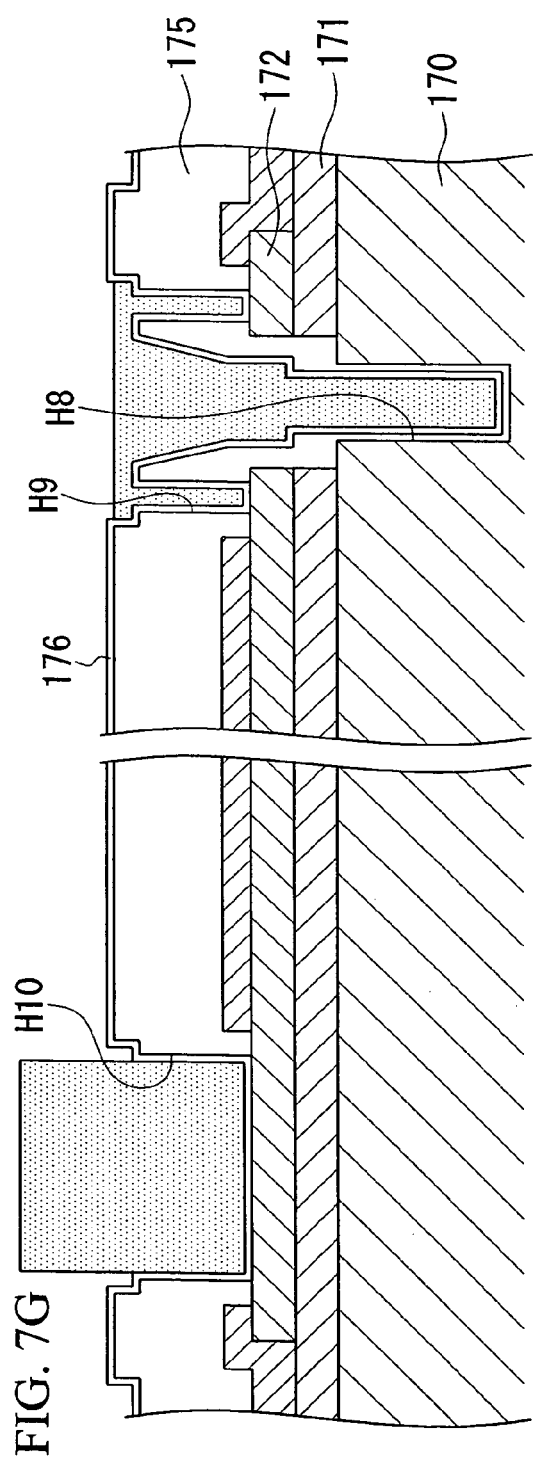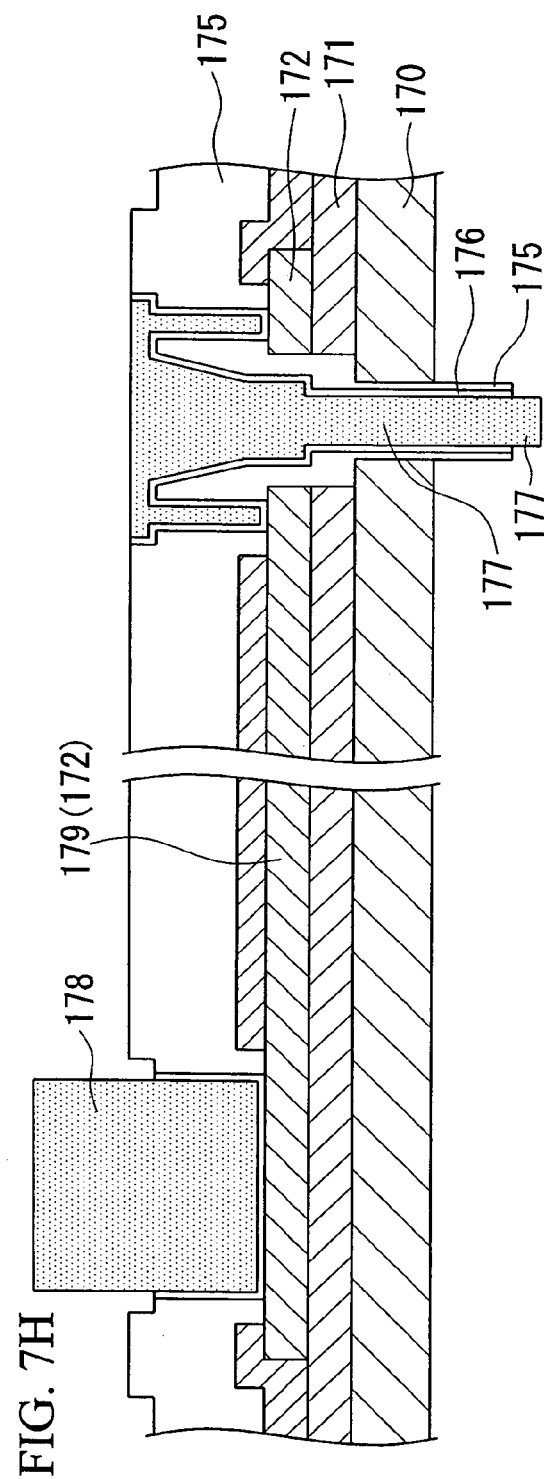

INTERMEDIATE CHIP MODULE, SEMICONDUCTOR DEVICE, CIRCUIT BOARD, AND ELECTRONIC DEVICE

Priority is claimed on Japanese Patent Application No. 2003-335675 filed Sep. 26, 2003, and Japanese Patent Application No. 2003-386512, filed Nov. 17, 2003, the contents of which are incorporated herein by reference.

BACKGROUND OF THE INVENTION

1. Field of the Invention

The present invention relates to an intermediate chip for electrically connecting semiconductor chips, and relates to a semiconductor device, a circuit board, and an electronic device having semiconductor chips electrically connected by means of such an intermediate chip. The present invention also relates to an intermediate chip module, a semiconductor device, a circuit board, and an electronic device.

2. Description of Related Art

Currently, efforts are being made to reduce the size of electronic components (e.g., semiconductor chips) used in mobile electronic devices, such as portable telephones, notebook personal computers, PDAs (Personal Data Assistants) in general, so that the size and weight of such devices are reduced. Spaces for mounting such electronic components are also limited. To achieve this, various methods for packaging semiconductor chips, for example, have been conceived of, and a packaging, known as CSP (chip scale package) is proposed at present. High-density packaging can be achieved with the CSP technique since the mounting areas of semiconductor chips which are manufactured using this CSP technique are comparable to those of conventional semiconductor chips.

In addition, a further reduction in size of and provision of multiple functions to the above-mentioned electronic devices are anticipated, and further increase in packaging density of semiconductor chips is required. In view of the above-mentioned background, a three-dimensional chip stacking technique has been proposed. The three-dimensional chip stacking technique achieves high-density packaging of semiconductor chips by stacking semiconductor chips having similar and/or different functions together and connecting them together via wiring (see, for example, Japanese Unexamined Patent Nos. 2002-170919 and 2002-100727).

In the three-dimensional chip stacking technique, increasing density of semiconductor chips has reduced pitches between terminals, making connection between the terminals and outside terminal difficult. Thus, a redistribution layer is required.

However, since all junctions of semiconductor chips are provided at the same position in the technique disclosed in JP 2002-170919, a redistribution layer cannot be achieved solely by this technique. On the other hand, in the technique disclosed in JP 2002-100727, wiring can be redistributed on a semiconductor chip to facilitate connection to outside terminals. However, since an additional wiring is added to a semiconductor circuit, the manufacturing process becomes complex, and the yield is reduced.

In the three-dimensional chip stacking technique, a redistribution layer is required for disposing pads and for stacking different kind of chips having different die sizes. Furthermore, a technique for easily manufacturing three-dimensional chips which simplify handling of the chips without incurring a decrease in yields has been desired. Furthermore, a technique which enhances flexibility in design and structure of three-dimensional stacked chips as well as easily allows for enhancement of characteristics of semiconductor devices has been also desired.

SUMMARY OF THE INVENTION

A first aspect of the present invention was conceived in view of the above-mentioned background, and an object thereof is to provide an intermediate chip for electrically connecting semiconductor chips, and a semiconductor device, a circuit board and an electronic device having such an intermediate chip, as a three-dimensional chip stacking technique which allows a redistribution layer without affecting the manufacturing process of the semiconductor chips.

To achieve the above-mentioned object, the intermediate chip according to the first aspect of the present invention includes: an intermediate chip for electrically connecting semiconductor chips; a substrate having a first side and a second side; a trans-substrate conductive plug which projects to the first side of the substrate; a post electrode which is displaced from the trans-substrate conductive plug in plan view on the second side of the substrate; and wiring which is disposed in or on the substrate for coupling the trans-substrate conductive plug and the post electrode.

In the intermediate chip described above, the trans-substrate conductive plug may also project to the second side of the substrate.

Such an intermediate chip allows three-dimensional packaging of semiconductor chips via the intermediate chip without affecting the manufacturing process of the semiconductor chips by connecting the semiconductor chips to each of the two sides of the intermediate chip. In addition, since the trans-substrate and post electrodes are displaced from each other by providing wiring to the intermediate chip, since the wiring extends to a desired position, a redistribution layer between semiconductor chips becomes available.

In the intermediate chip described above, the substrate is preferably made of silicon.

With this aspect, since the thermal expansion coefficient of the intermediate chip becomes equal to that of semiconductor chips made of silicon, disadvantages, such as peeling off of connecting members which connect the intermediate chip and the semiconductor, and cracking, due to differences in thermal expansion coefficients, can be prevented.

In the intermediate chip described above, a plurality of sets of the trans-substrate conductive plug, the post electrode and the wiring for coupling the trans-substrate conductive plug and the post electrode can be provided.

With this aspect, a single intermediate chip can provide a plurality of electrical connections between semiconductor chips.

In the intermediate chip described above, the different sets of wires may be crossed together in plan view. This allows a complex redistribution layer.

In the intermediate chip described above, a plurality of trans-substrate conductive plugs may be coupled to single wiring.

With this aspect, a plurality of electrodes of a semiconductor chip and one electrode of another semiconductor chip can be electrically connected.

In the intermediate chip described above, a plurality of post electrodes may be coupled to single wiring.

With this aspect, one electrode of a semiconductor chip and a plurality of electrodes of another semiconductor chip can be electrically connected.

In the intermediate chip described above, at least one of the trans-substrate conductive plug, the post electrode, and the wiring preferably is made of copper since copper exhibits an excellent conductivity.

The first aspect of semiconductor device according to the present invention is directed to a semiconductor device includes: first semiconductor chip having a first trans-substrate conductive plug; a second semiconductor chip having a second trans-substrate conductive plug, the second trans-substrate conductive plug being displaced from the first trans-substrate conductive plug in plan view; and an intermediate chip having a third trans-substrate conductive plug, a post electrode, and wiring, the post electrode being displaced from the third trans-substrate conductive plug, the wiring connecting the third trans-substrate conductive plug and the post electrode, wherein the third trans-substrate conductive plug and the first trans-substrate conductive plug of the first semiconductor chip are connected at one side of the intermediate chip, and the post electrode connected from the third trans-substrate conductive plug via the wiring and the second semiconductor chip of the second trans-substrate conductive plug are connected at the other side of the intermediate chip. As used herein, a semiconductor device having the intermediate chip described above and a semiconductor chip is referred to as an "intermediate chip module".

The above-mentioned semiconductor device allows three-dimensional packaging of semiconductor chips using the intermediate chip without adversely affecting manufacturing processes for semiconductor chips. Furthermore, since the wiring extends to a desired position, a redistribution layer between semiconductor chips becomes available.

In the above-mentioned semiconductor device, a plurality of intermediate chips may be stacked together, and respective electrodes of each chip may be coupled.

With this aspect, a complex redistribution layer which cannot be provided by a single intermediate chip can be provided by arranging a plurality of intermediate chips.

Furthermore, in the semiconductor device described above, the first and second semiconductor chips may be different kinds of chips.

With this aspect, three-dimensionally packaged semiconductor devices can be flexibly designed. Accordingly, characteristics of such semiconductor devices, such as providing multiple functions, can be enhanced.

Furthermore, in the semiconductor device described above, the substrate of the intermediate chip preferably has the same thickness and the same size as the substrate of the first or second semiconductor chip.

With this aspect, the number of the type of substrates used can be reduced; thus reduction in manufacturing costs can be achieved. Furthermore, since a majority of chips have substantially the same thickness, the height of a semiconductor device made by stacking the chips is roughly dependent on the number of stacked chips; thus design of electronic devices having these semiconductor devices can be standardized.

The circuit board according to the first aspect of the present invention includes the semiconductor device described above.

Since a semiconductor device in which semiconductor chips are three-dimensionally packaged via an intermediate chip is mounted on this circuit board, the density of the circuit board can be increased. In addition, such a semiconductor device can be flexibly mounted on a circuit board since a redistribution layer between semiconductor chips becomes available in the semiconductor device.

The electronic device according to the first aspect of the present invention includes the semiconductor device mentioned above.

Since such an electronic device has a semiconductor device in which semiconductor chips are three-dimensionally packaged via an intermediate chip, the density of the electronic device can be enhanced. In addition, such a semiconductor device can be flexibly mounted on an electronic device since a redistribution layer between semiconductor chips becomes available in the semiconductor device.

A second aspect of the present invention was conceived in view of the above-mentioned background, and an object thereof is to provide an intermediate chip module, a semiconductor device, and a circuit board and an electronic device having such an intermediate chip in which a redistribution layer is readily available using a three-dimensional chip stacking technique, handling of chips becomes easier, and the efficiency of manufacturing process is enhanced.

To solve the above-mentioned problems, the intermediate chip module according to the second aspect of the present invention includes: an intermediate chip which is capable of electrically connecting a plurality of chips; and a semiconductor chip having an active side and a back side; wherein the intermediate chip and the plurality of semiconductor chips are attached so as to form a single unit.

According to the second aspect of the present invention, since the intermediate chip which is capable of electrically connecting a plurality of thin chips and the semiconductor chip are attached so as to form a single unit, the strength of the chips is enhanced and decrease in yield is prevented, and handling of the chips becomes easier when chips are stacked three-dimensionally. For example, by forming different kinds of intermediate chip modules and selecting desired intermediate chip modules from these intermediate chip modules, various kinds of semiconductor devices can be easily manufactured. In addition, flexibility in design and structure of three-dimensional stacked chips are enhanced. Accordingly, characteristics of such semiconductor devices, such as providing multiple functions, can be enhanced. Furthermore, an intermediate chip module having an intermediate chip facilitates a redistribution layer between predetermined chips.

In the intermediate chip module according to the second aspect of the present invention, the intermediate chip is attached to at least one of the active side and the back side of the semiconductor chip.

According to the second aspect of the present invention, an intermediate chip is connected to at least one of an active side on which elements and circuits are provided and a back side of a semiconductor chip. This allows formation of semiconductor devices having various configurations, thus flexibility in design and structure of three-dimensional stacked chips are enhanced. For example, by attaching the intermediate chip to the active side of semiconductor chip, another semiconductor chip (or another intermediate chip or intermediate chip module) can be easily attached to the active side of the semiconductor chip via the intermediate chip; thus semiconductor devices which require a redistribution layer can be easily manufactured. In addition, by attaching the intermediate chip to the active side of the semiconductor chip, elements and circuits mounted on the active side can be protected. Similarly, by attaching an intermediate chip to the back side of a semiconductor chip, another semiconductor chip (or another intermediate chip or intermediate chip module) can be easily attached to the back side of the semiconductor chip via the intermediate chip.

In the intermediate chip module according to the second aspect of the present invention, an intermediate layer is provided between the intermediate chip and the semiconductor chip.

According to the second aspect of the present invention, the intermediate layer which is provided between the intermediate chip and the semiconductor functions as a reinforcing layer; thus problems, e.g., bend (deformation) of or damage to the chips can be prevented. Especially when an intermediate chip module is attached to or mounted on another chip or intermediate chip module, such problems, e.g., bend of or damage to the chips, can be prevented. Thus, such an intermediate layer for reinforcing chips can facilitate handling of chips and prevent reduction in yield. The intermediate layer may be provided for purposes other than reinforcing chips, for example, for enhancing connecting strength between chips, for providing insulation between wiring for preventing short circuit, or for adjusting the overall height of intermediate chip modules. Materials used for forming intermediate layers can be selected according to the purposes.

In the intermediate chip module according to the second aspect of the present invention, the intermediate layer may include a layer which includes at least a dielectric film.

According to the second aspect of the present invention, the dielectric film included in the intermediate layer can prevent short circuit (short) between chips when the chips are stacked; thus reliability of the intermediate chip module is further enhanced.

In the intermediate chip module according to the second aspect of the present invention, the intermediate chip includes a passive element.

In other words, the intermediate chip (intermediate chip module) may include a resistor element or a passive element, such as a capacitor or a coil. Since each of the intermediate chip and the semiconductor chip can be electrically connected to a passive element, chips can be connected via the passive element; thus flexibility of design and structure of semiconductor devices can be further enhanced.

In the intermediate chip module according to the second aspect of the present invention, the passive element may be provided on at least one of the front size and the back side of the intermediate chip.

Thus, various types of intermediate chip modules can be formed with a simple configuration of providing passive elements on front and back sides of the intermediate chip to electrically connect chips. By selecting any combination of intermediate chip modules from these intermediate chip modules and attaching them together, various types of semiconductor devices can be easily manufactured.

The intermediate chip module according to the second aspect of the present invention may include a plurality of different kinds of passive elements.

Thus, various types of intermediate chip modules can be manufactured easily; thus flexibility of design and structure of semiconductor devices in which various intermediate chip modules are used in combination can be further enhanced. When passive elements are provided on both the front and back sides of an intermediate chip, a first passive element provided on the front surface and a second passive element provided on the back side may be of different kinds. Alternatively, when a plurality of passive elements are provided on either the front size or the back side of the intermediate chip, the plurality of passive elements may be of different kinds.

The semiconductor device according to the second aspect of the present invention includes a stacked body in which a plurality of intermediate chip modules are stacked together. The intermediate chip modules are formed into a single unit by attaching an intermediate chip which is capable of electrically connecting a plurality of chips and a semiconductor chip together.

According to the second aspect of the present invention, an intermediate chip module is formed by attaching an intermediate chip which is capable of electrically connecting a plurality of chips and a semiconductor chip together so that they form a single unit. Thus, the semiconductor device can be easily manufactured with a simple configuration of stacking the multiple intermediate chip modules. For example, by forming different kinds of intermediate chip modules and selecting desired intermediate chip modules from these intermediate chip modules, various kinds of semiconductor devices can be easily manufactured. In addition, flexibility in design and structure of three-dimensional stacked chips are enhanced. Accordingly, characteristics of such semiconductor devices, such as providing multiple functions, can be enhanced. Furthermore, an intermediate chip module having an intermediate chip facilitates a redistribution layer between predetermined chips. Furthermore, the strength of the chips is enhanced and decrease in yield is prevented by such a module, in addition to making handling easier.

In the semiconductor device according to the second aspect of the present invention, intermediate chip modules of the same kind may be stacked. Alternatively, intermediate chip modules of different kinds may be stacked. In any case, semiconductor devices having various configurations can be manufactured easily, thus flexibility in design and structure of three-dimensional stacked chips are enhanced. As used herein, "different intermediate chip modules" includes various cases. One such case may include, but not be limited to, cases in which the post and trans-substrate conductive plugs are displaced from each other in plan view, chips contained in the intermediate chip module are stacked in different manners, types of intermediate chip modules included in the semiconductor chips or intermediate chip are different, the sizes of the chips included in an intermediate chip module are different (or combination of different sizes), and the sizes of the intermediate chip module are different.

The circuit board according to the second aspect of the present invention includes the semiconductor device described above.

According to the second aspect of the present invention, since the semiconductor device is formed by stacking intermediate chip modules, density can be enhanced; thus a circuit board which can be flexibly packaged can be provided.

The electronic device according to the second aspect of the present invention includes the semiconductor device described above.

According to the second aspect of the present invention, since the circuit board includes the semiconductor device formed by stacking intermediate chip modules, density can be enhanced; thus a semiconductor device which can be flexibly packaged can be provided.

BRIEF DESCRIPTION OF THE DRAWINGS

FIGS. 7A–H are schematic diagrams illustrating an example of process steps manufacturing a trans-substrate conductive plug and a post electrode of an intermediate chip;

DETAILED DESCRIPTION OF THE INVENTION (First Aspect)

A first aspect of the present invention will be described in detail.

The term "intermediate chip" refers to a chip which electrically connects a plurality of semiconductor chips. An intermediate chip may also be referred to as a "connecting intermediate chip."

Figure 1:
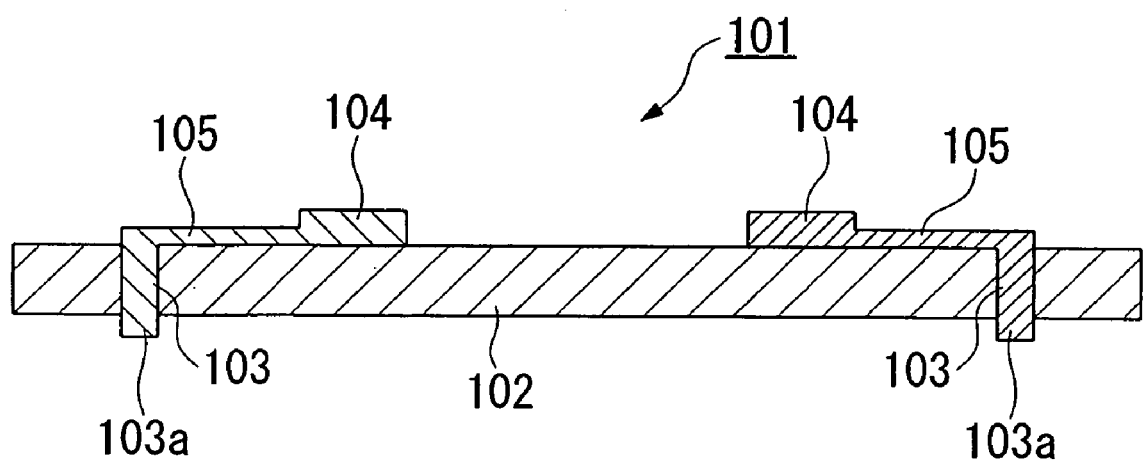
FIG. 1 illustrates a first embodiment of an intermediate chip according to the first aspect of the present invention.

FIG. 1 illustrates a first embodiment of an intermediate chip according to the first aspect of the present invention, and reference numeral 101 denotes an intermediate chip. The connecting intermediate chip 101 includes a substrate 102 made of silicon, trans-substrate conductive plugs 103 projecting to the back side of the substrate 102, post electrodes 104 which are provided on the front surface of the substrate 102, and wirings 105 which couple the trans-substrate conductive plugs 103 and the post electrodes 104. It should be understood that the trans-substrate conductive plugs 103 may be projected to the front surface of the substrate 102, and the post electrodes 104 may be provided on the back side of the substrate 102. As used herein a "trans-substrate conductive plug" refers to a conductive plug penetrating through a substrate.

In the present embodiment, the trans-substrate conductive plugs 103 are formed so that the trans-substrate conductive plugs 103 pass through the substrate 102, and one end of a trans-substrate conductive plug 103 projects to the back side of the substrate 102, and another end is exposed to the front surface of the substrate 102. The post electrodes 104 and protrusions 103a of the trans-substrate conductive plug 103 are arranged so that they are displaced from each other in plan view.

The wirings 105 are disposed on the front surface of the substrate 102, and extend between the other end of the trans-substrate conductive plug 103 and the post electrode 104 so that they are coupled to each other. Having this structure, the connecting intermediate chip 101 allows a redistribution layer between the protrusion 103a of the trans-substrate conductive plug 103 and the post electrode 104.

The connecting intermediate chip 101 shown in FIG. 1 has a plurality (two) of sets of the trans-substrate conductive plug 103, the post electrode 104 and the wiring 105. Thus, a single connecting intermediate chip 101 can provide connection across terminals of the plurality (two) sets of different semiconductor chips, as described below.

Although not shown in FIG. 1, one wiring 105 may couple to a plurality of the trans-substrate conductive plugs 103 and one post electrode 104, or conversely, one wiring 105 may couple to one trans-substrate conductive plug 103 and a plurality of the post electrodes 104. Furthermore, one wiring may be conducting to a plurality of the trans-substrate conductive plugs 103 and one post electrode 104. In this configuration, electrical connection between one or more electrodes of one semiconductor chip and one or more electrodes of another semiconductor chip is obtained only by the connecting intermediate chip 101.

Figure 2A:
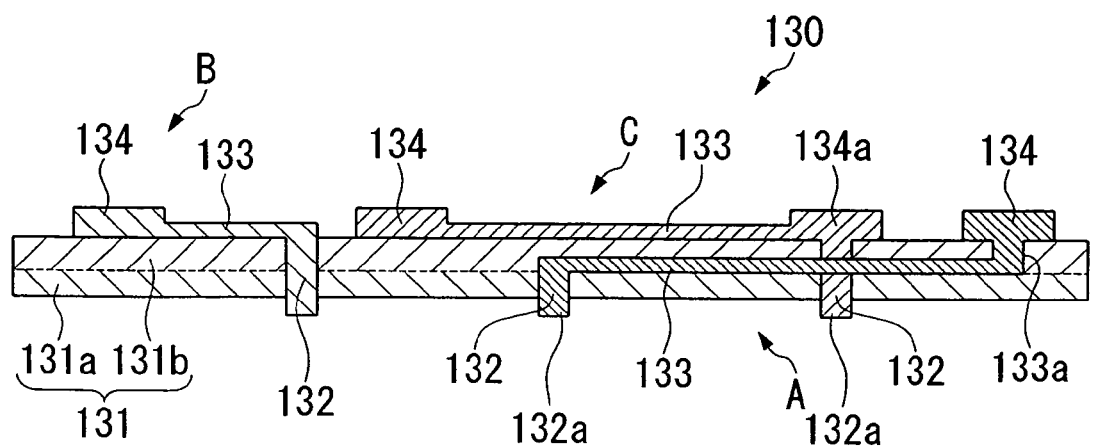
FIGS. 2A and 2B illustrate a second embodiment of an intermediate chip.

FIG. 2A is a diagram illustrating a second embodiment of the intermediate chip according to the present invention, and reference numeral 130 denotes an intermediate chip. The connecting intermediate chip 130 differs from the intermediate chip 101 shown in FIG. 1 in that one of the sets of the trans-substrate, the post electrode and the wiring has a multilayered interconnection structure. That is, the substrate 131 of the connecting intermediate chip 130 includes a silicon substrate 131a and a dielectric layer 131b which includes an interlayer dielectric film formed on the silicon substrate 131a. On the substrate 131 having the above-described structure, three of sets of the trans-substrate, the post electrode and the wiring are formed.

In Set A of these three sets, an end of the trans-substrate conductive plug 132 which opposes to the protrusion 132a extends to the front surface of the silicon substrate 131a, and connects (couples) to the wiring 133 thereon. The wiring 133, in turn, extends to a desired position on the front surface of the silicon substrate 131a, and connects (couples) to the post electrode 134 formed on the front surface of the dielectric layer 131b. In this configuration, the structure consisting of the trans-substrate conductive plug 132, the wiring 133 and the post electrode 134 forms the multilayered interconnection structure described above.

In Set B, another one of the three sets, the trans-substrate conductive plug 132, the post electrode 134 and the wiring 133 have the same structure as the trans-substrate conductive plug 103, the post electrode 104 and the wiring 105 of the intermediate chip 101. One exception is that the trans-substrate conductive plug 132 of Set B passes through the silicon substrate 131a and the dielectric layer 131b, and one of ends thereof is exposed on the dielectric layer 131*b*. The post electrode 134 and the wiring 133 are both formed on the dielectric layer 131, and connect (couple) to the trans-substrate conductive plug 132.

In addition, Set C, the other one of the sets, basically has the same structure as Set B mentioned above. One exception is that an additional post electrode 134*a* is formed on an opposing end of the protrusion 132*a* of the trans-substrate conductive plug 132 of Set C. Thus, two post electrodes 134 and 134*a* are provided to the wiring 133 which connects to the trans-substrate conductive plug 132.

Figure 2B:
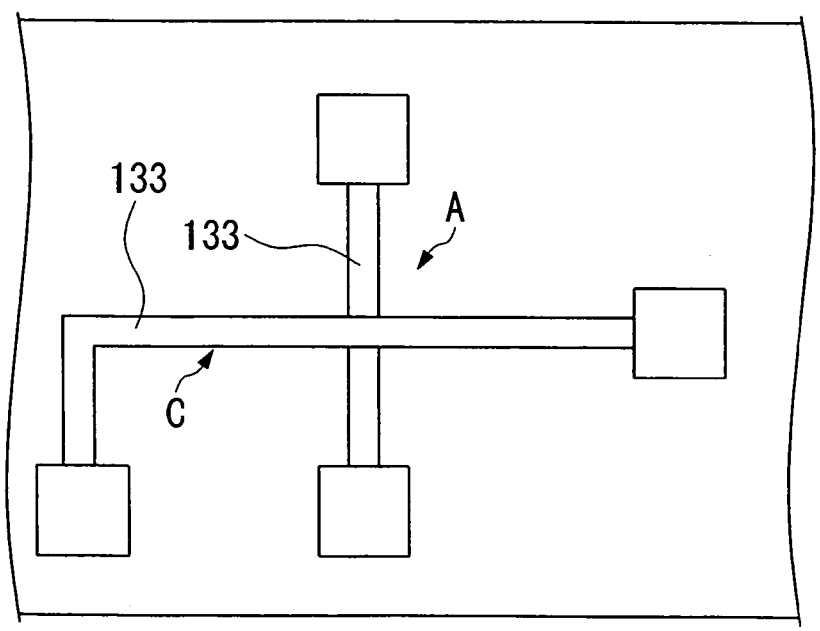

As can be seen from FIG. 2B, the wirings 133 of Sets A and C are disposed so that they do not contact and cross each other in plan view. On other words, the present embodiment allows such a redistribution layer so that the wirings cross each other while not contacting by constructing one of the sets as a multilayered interconnection structure.

Accordingly, the connecting intermediate chip 130 according to the present embodiment allows a complex redistribution layer since it has such a multilayered interconnection structure.

Next, a semiconductor device including the connecting intermediate chips 101 and 130 according to the present invention will be explained.

Figure 3:
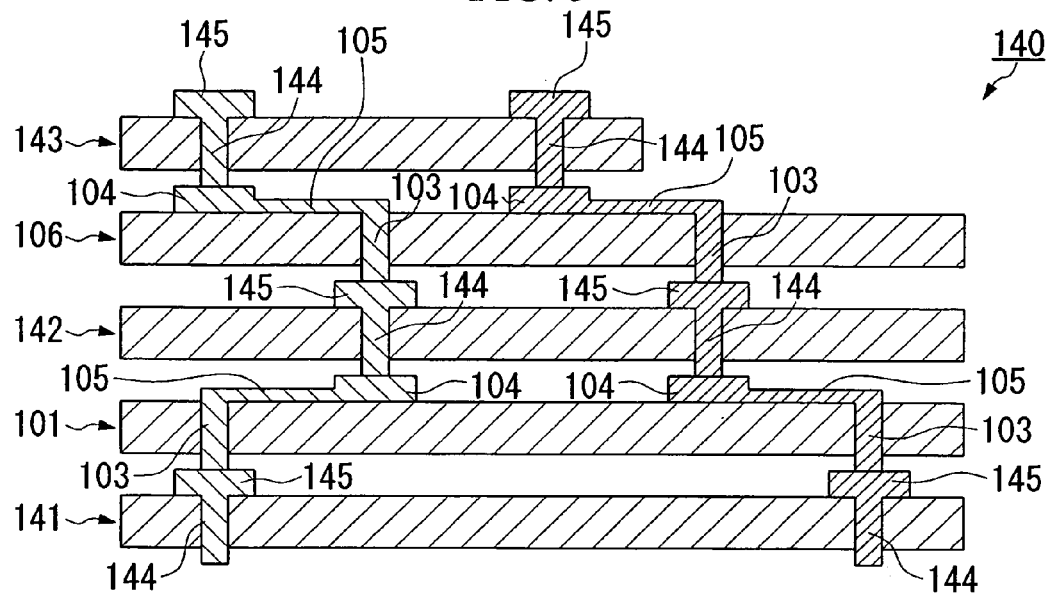
FIG. 3 illustrates an example of a semiconductor device according to the first aspect of the present invention.

FIG. 3 is a diagram of one example of a semiconductor device having the connecting intermediate chip 101 shown in FIG. 1. In this figure, reference numeral 140 denotes a semiconductor device. The semiconductor device 140 includes a first semiconductor chip 141, a connecting intermediate chip 101, a second semiconductor chip 142, a connecting intermediate chip 106, and a third semiconductor chip 143, which are stacked together in this order.

In the first, second and third semiconductor chips 141, 142 and 143, the trans-substrate conductive plugs 144 and post electrodes 145 are formed as connecting electrodes which function as connecting members used for three-dimensional packaging, and they are formed separately from elements and circuits (not shown). In other words, in these semiconductor chips 141, 142 and 143, the post electrodes 145 are formed on an active side of the respective substrate in which elements and circuits are formed, and the trans-substrate conductive plugs 144 are projected to the opposing side (back side) to couple to the post electrodes 145. In the semiconductor device 140 of the present embodiment, while the substrates of the first and second semiconductor chips 141 and 142 have similar shape, the substrate of the third semiconductor chip 143 is smaller than substrates of the first and second semiconductor chips 141 and 142.

The connecting intermediate chip 101 has the same structure as the intermediate chip shown in FIG. 1, and the connecting intermediate chip 106 is similar to the connecting intermediate chip 101 except for the positions of the trans-substrate conductive plugs 103, the post electrodes 104, the wirings 105.

The semiconductor chips 141, 142 and 143 and the connecting intermediate chips 101 and 106 are stacked together by connecting the post electrodes 145 of the semiconductor chips and the trans-substrate conductive plug 103 of the connecting intermediate chips 101 and 106 by means of lead-free solder (not shown), for example, and connecting the trans-substrate conductive plugs 144 of the semiconductor chips and the post electrodes 104 of the connecting intermediate chips 101 and 106 by means of lead-free solder (not shown), for example.

In this configuration, by stacking the semiconductor chips 141, 142 and 143 via the connecting intermediate chips 101 and 106, wirings of the trans-substrate conductive plugs 103 and the post electrode 104 which are dispositional in plan view can be redistributed. Furthermore, in this example, by stacking the second and third semiconductors chips 142 and 143 having different sizes via the connecting intermediate chip 106, flexibility of structure of the three-dimensionally packaged semiconductor device 140 can be enhanced. Thus, the characteristics of the semiconductor device 140, e.g., multifuntionality, can be enhanced.

In this example, all of the substrates of the semiconductor chips 141, 142 and 143, and the substrates of the connecting intermediate chips 101 and 106 are silicon substrates. Thus, thermal expansion coefficient of the connecting intermediate chips 101 and 106 becomes equal to thermal expansion coefficient of the semiconductor chips 141, 142 and 143; thus, peel-off of connecting members (solder) between electrodes of the connecting intermediate chips 101 and 106, and the semiconductor chips 141, 142 and 143, and the like, caused by difference in the thermal expansion coefficient can be prevented.

In addition, the substrates of the first and second semiconductor chips 141 and 142 and the substrates of the connecting intermediate chips 101 and 106 have the same size and the same shape. Accordingly, this allows standardization of substrates used; thus reduction in manufacturing cost can be achieved. In addition, since all of the chips have substantially the same thickness, and the thickness of the semiconductor device 140 can be roughly determined by the number of chips stacked together. Accordingly, when designing devices having the semiconductor device 140, the size of the space needed to mount the semiconductor device 140 can be standardized to multiples of the thickness of chips by the number of chips stacked.

Figure 4:
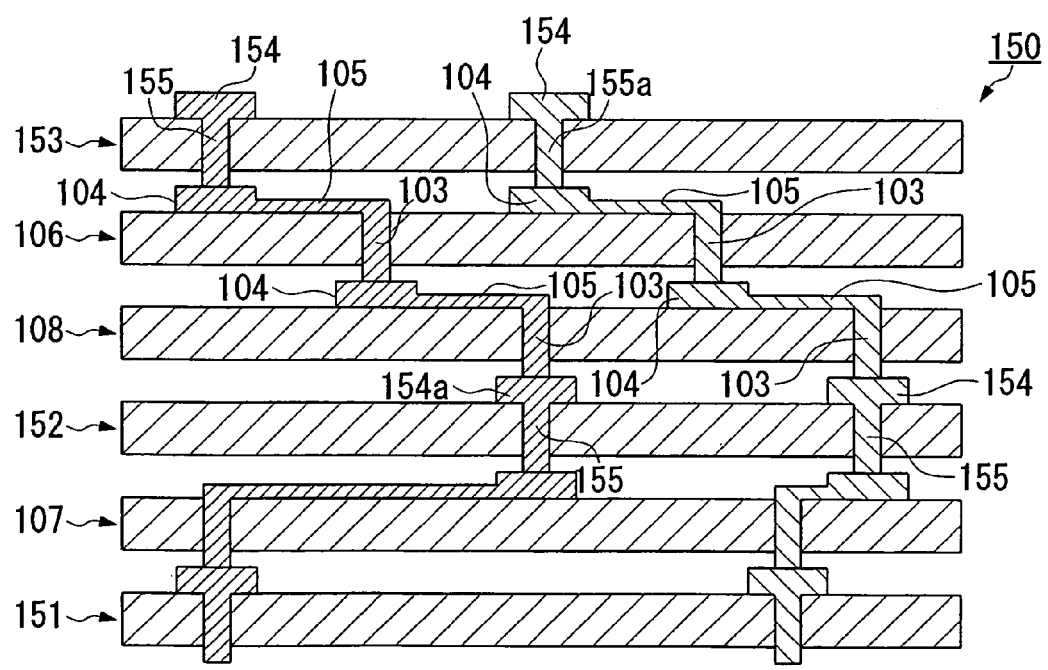
FIG. 4 is a diagram illustrating another example of a semiconductor device according to the first aspect of the present invention.

FIG. 4 is a diagram illustrating another example of a semiconductor device having the connecting intermediate chip 101 shown in FIG. 1. In the figure, reference numeral 150 denotes a semiconductor device. The semiconductor device 150 is formed by stacking a fourth semiconductor chip 151, a connecting intermediate chip 107, a fifth semiconductor chip 152, a connecting intermediate chip 108, a connecting intermediate chip 106, and a sixth semiconductor chip 153 in this order.

In the semiconductor device 160 of the present embodiment, one of the post electrodes 154*a* of the fifth semiconductor chip 152 and one of the trans-substrate conductive plugs 155*a* of the sixth semiconductor chip 153 are positioned at the same position in plan view between the fifth and sixth semiconductor chips 152 and 153 although they are not connected.

If the fifth and sixth semiconductor chips 152 and 153 were stacked together using a single connecting intermediate chip, trans-substrate conductive plug for connecting to the post electrodes 154*a* of the fifth semiconductor chip 152, and post electrodes for connecting the trans-substrate conductive plugs 155*a* of the sixth semiconductor chip 153 would be provided at the same position, and short circuit would occur in this connecting intermediate chip between them. Therefore, a redistribution layer of each electrode is made possible to prevent such short circuit by using the connecting intermediate chip 108 and the connecting intermediate chip 106 as connecting intermediate chips.

Thus, by arranging a plurality (two, in this example) of connecting intermediate chips 108 and 106, a complex redistribution layer which can never be achieved with a single intermediate chip may be possible; thus flexibility of redistribution can be significantly enhanced.

Figure 5:
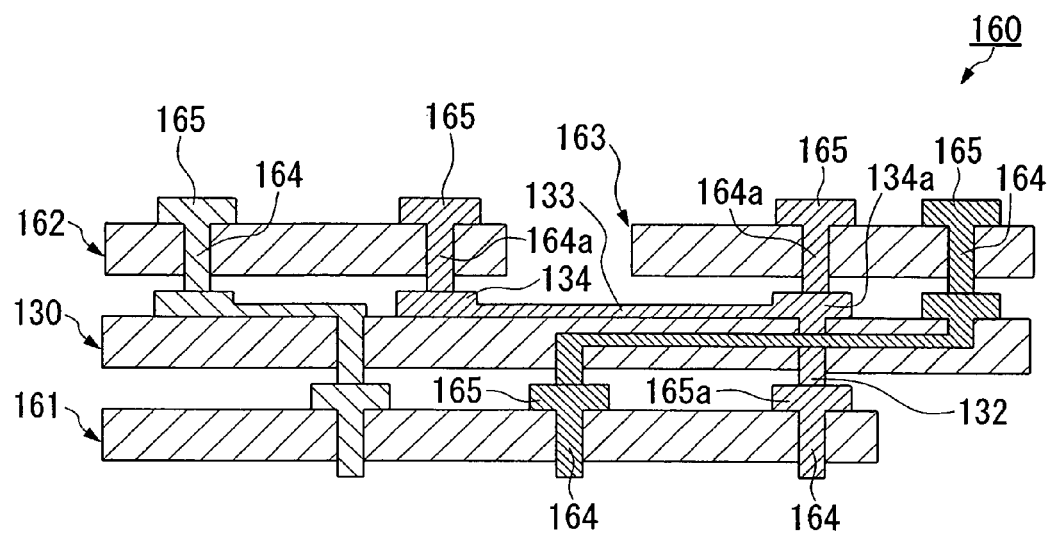
FIG. 5 illustrates yet another example of a semiconductor device according to the first aspect of the present invention.

FIG. 5 is a diagram illustrating one example of a semiconductor device having the connecting intermediate chip 130 shown in FIGS. 2A and 2B. In this figure, reference numeral 160 denotes a semiconductor device. The semiconductor device 160 includes a seventh semiconductor chip 161, a connecting intermediate chip 130, an eighth second semiconductor chip 162, and a ninth semiconductor chip 163, which are stacked together in this order.

In the semiconductor device 160 of this example, the eighth and ninth semiconductor chips 162 and 163 are of the same kind of chip while the seventh semiconductor chip 161 are of different kinds from the eighth and ninth semiconductor chips 162 and 163. The eighth and ninth semiconductor chips 162 and 163 are both stacked above the connecting intermediate chip 130. One of the post electrodes 165a of the seventh semiconductor chip 161 is coupled to the respective trans-substrate conductive plugs 164a of the eighth and ninth semiconductor chips 162 and 163.

That is, in the semiconductor device 160 of this example, the connecting intermediate chip 130 allows a redistribution layer in which the wirings are crossed each other in plan view. Accordingly, a complex redistribution layer can be achieved by with the single connecting intermediate chip 130 without requiring stacking multiple chips, which is difficult to achieve with the single-structured connecting intermediate chips 101, 106, 107 and 108 shown in FIGS. 3 and 4. Thus, flexibility of a redistribution layer can be significantly enhanced.

It should be understood that semiconductor devices include intermediate chip modules which are formed by stacking the above-described semiconductor chips so that they form a single module.

Next, the structure of trans-substrate and post electrodes of each of the semiconductor chips in the semiconductor device 140, 150, and 160 having the above-mentioned structure will now be explained based on a manufacturing method therefor.

Figure 6A:
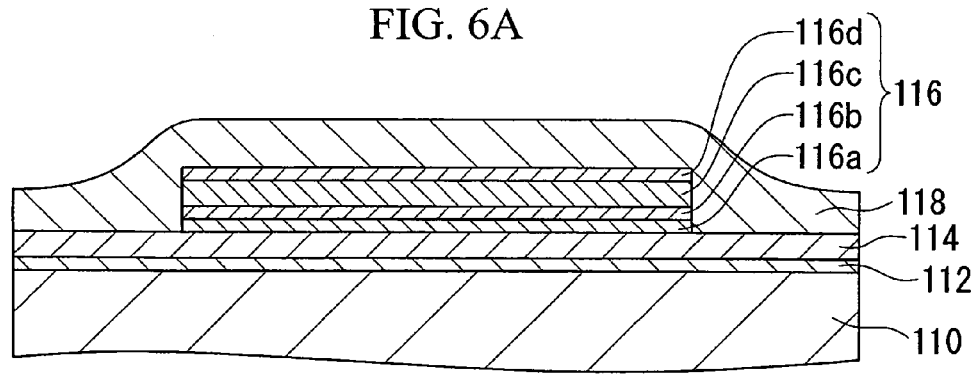
FIGS. 6A–J are schematic diagrams illustrating an example of process steps for manufacturing a trans-substrate conductive plug and a post electrode of a semiconductor chip.

First, a structure of a semiconductor chip before formation of trans-substrate and post electrodes will be explained. In FIG. 6A, a dielectric film 112 is formed on the front surface of a silicon substrate 110, on which an integrated circuit including transistors, memory elements, and other electronics elements, which are not shown in the figure, are formed.

The dielectric film 112 is made of, for example, silicon dioxide ($SiO_2$), which is an oxide of silicon (Si), the material of the substrate 110.

On the dielectric film 112, an interlayer dielectric film 114 which is made of borophosphosilicate glass (hereinafter referred to as BPSG) is formed. On the interlayer dielectric film 114, an electrode pad 116 which is connected to the integrated circuit formed on the substrate 110 at a location which is not shown in this figure is formed. The electrode pad 116 includes, for example, a first layer 116a made of titanium (Ti), a second layer 116b made of titanium nitride (TiN), a third layer 116c made of aluminum/copper (AlCu), and a fourth layer (cap layer) 116d made of TiN, which are stacked together in this order.

The electrode pad 116 is formed, for example, by providing a layered structure including the first to fourth layers 116a–116d on the interlayer dielectric film 114 by sputtering, and then patterning the layered structure into a predetermined shape (for example, a circular shape) using a resist. Although the electrode pad 116 has the layered structure in this example, the electrode pad 116 may be made only of aluminum (Al). However, the electrode pad 116 is preferably made of copper which exhibits low electric resistance. The structure of the electrode pad 116 is not limited to the particular structure described above, it may be changed as appropriate according to required electrical, physical and chemical properties. In this example, no electronic circuit is formed under the electrode pad 116.

The passivation film 118 is formed the interlayer dielectric film 114 as a dielectric layer on covering the electrode pad 116. The passivation film 118 may be made of silicon oxide ($SiO_2$), silicon nitride (SiN), or polyimide resin and the like.

In this non-limiting example, the passivation film 118 is made of $SiO_2$ or SiN. The thickness of the passivation film 118 is preferably about 0.5 μm.

Next, steps for forming trans-substrate and post electrodes in the semiconductor chip having the structure mentioned above will be explained in order. First, a layer of resist (not shown) is formed on the entire surface of the passivation film 118 using any conventional resist coating method including spin coating, dipping and spray coating. The resist is used for forming an opening in the passivation film 118 which covers the electrode pad 116. The resist may be any type of resist, e.g., photoresist, electron beam resist, X-ray resist, and may be either positive or negative resist.

Figure 6B:
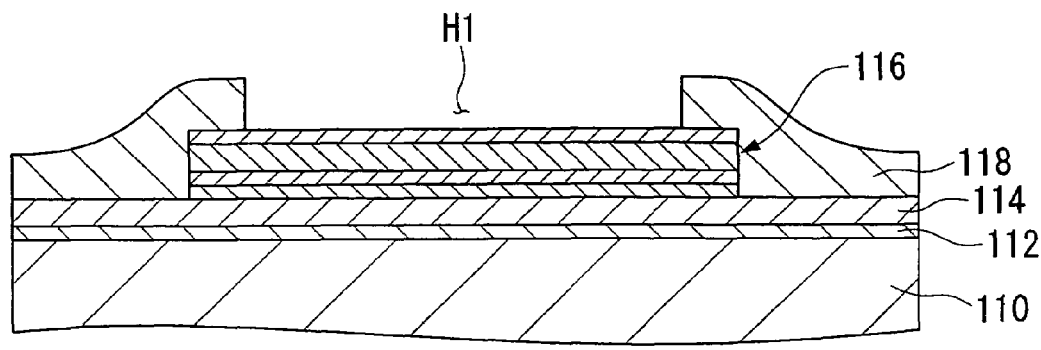

After the resist is applied on the passivation film 118, the resist is pre-baked. The resist is patterned to a desired pattern by exposure and development processes using a mask with a desired pattern formed thereon. The pattern of the resist is selected according to the shape of openings to be formed in the electrode pad 116 and the substrate 110. After the resist is patterned to the desired pattern, the resist is post-baked. Then an opening Hi is formed by etching a portion of the passivation film 118 which covers the electrode pad 116 as shown in FIG. 6B. FIG. 6B is a cross-sectional view of the substrate in which the opening H1 which has been formed by opening the passivation film 118.

As a etching technique, dry etching is preferably used. More specifically, reactive ion etching (RIE) is preferably used. Alternatively, wet etching technique may be used. The size of the opening is larger than the diameter of an opening which is to be formed on the electrode pad 116 in the next step and the diameter of an opening which is to be formed on the substrate 110 in a later step, and is smaller than the size of the pad. The size of the opening may be, for example, about 90 μm. Then the resist is removed, e.g., by means of remover or ashing process. The processing steps which have been described are the same as processing steps for manufacturing semiconductor chips.

Figure 6C:
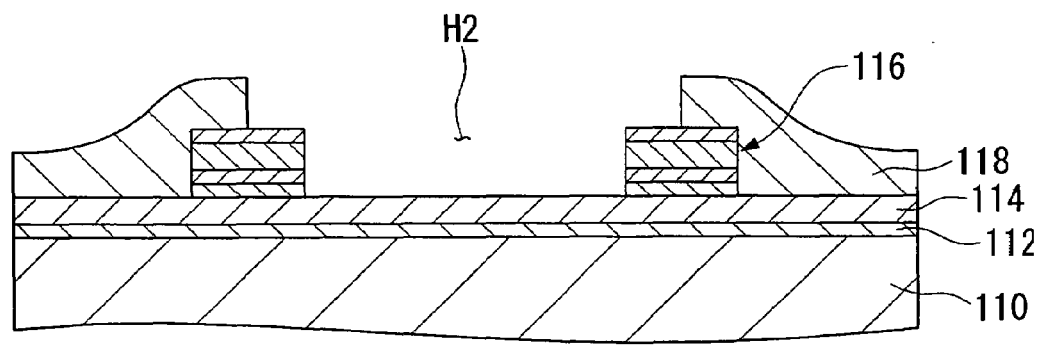

After the above-mentioned step is completed, an opening H2 is formed in the electrode pad 116, the interlayer dielectric film 114 thereunder and the dielectric film 112. A part of the substrate 110 is exposed by this step. The opening H2 having a desired size is formed with the photolithography process mentioned above using a resist. FIG. 6C is a cross-sectional view of the substrate in which the opening is formed in the electrode pad, the interlayer dielectric film 114 and the dielectric film 112a and part of the substrate 110 has been exposed. The size of the opening H2 is smaller than the opening H1, and is larger than the diameter of a plug which is to be formed in the next step. The size of the opening H2 is, for example, about 60 μm.

Figure 6D:
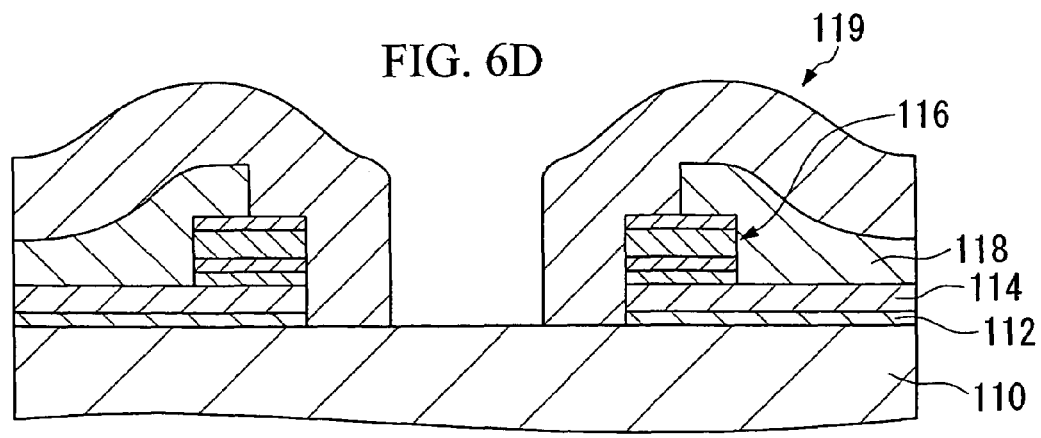

Next, an etching mask 119 is formed on the substrate. The etching mask 119 is used as a mask during dry etching process of silicon. The etching mask 119 may be made of $SiO_2$ or SiN. Alternatively, the etching mask 119 may be formed by stacking $SiO_2$ and SiN. The thickness of the etching mask 119 is determined so that a sufficient aspect ratio for providing a hole having a desired depth on the substrate is ensured. Preferably, the thickness of the etching mask 119 is 2 μm or more. A thickness of 2 μm or more is referable for ensuring the aspect ratio described previously. The opening in the etching mask is formed by patterning with photolithography process using the resist, as described above. FIG. 6D is a cross-sectional view of the substrate in which an opening has been formed in the etching mask. The diameter of the opening is selected to be the same as the diameter of plug, and may be about 30 µm, for example.

Figure 6E:
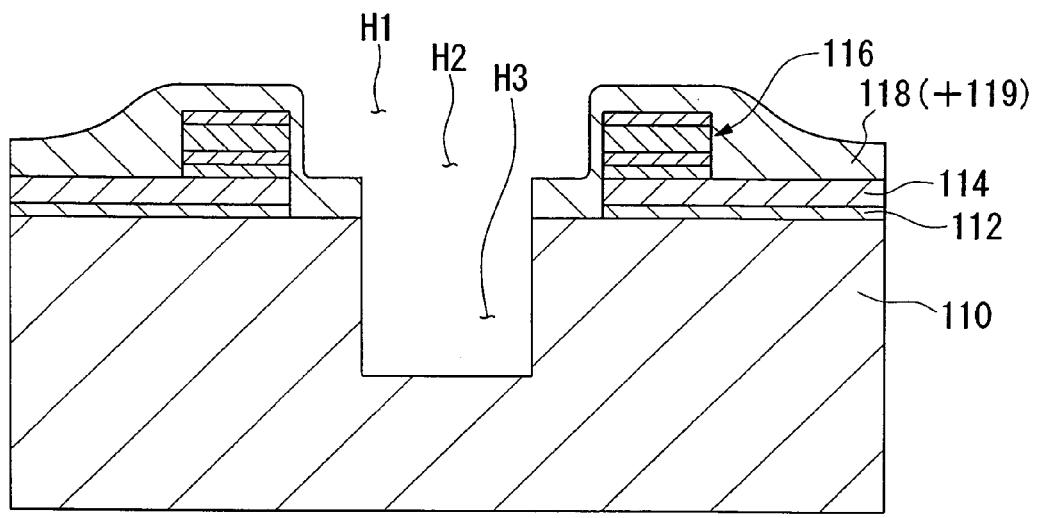

As shown in FIG. 6E, a hole is formed in the substrate 110 by means of a dry etching process by using the etching mask 119 as a mask. In this process, inductively coupled plasma (ICP) etching may be alternatively used instead of RIE. FIG. 6E is a cross-sectional view of the substrate in which the hole H3 has been formed in the substrate 110. The depth of the hole H3 is selected according to the final thickness of the semiconductor chip. The depth of the hole H3 may be about 70 µm, for example.

As shown in FIG. 6E, during the dry etching process in which the hole H3 is formed in the substrate 110, the etching mask 119 is slowly etched. Upon completion of formation of the hole H3, the etching mask 119 is almost completely removed. In FIGS. 6E–6J, the residue of the etching mask 119 is omitted. In those figures, the residue of the etching mask 119 is shown to be included in the passivation layer 118.

Figure 6F:
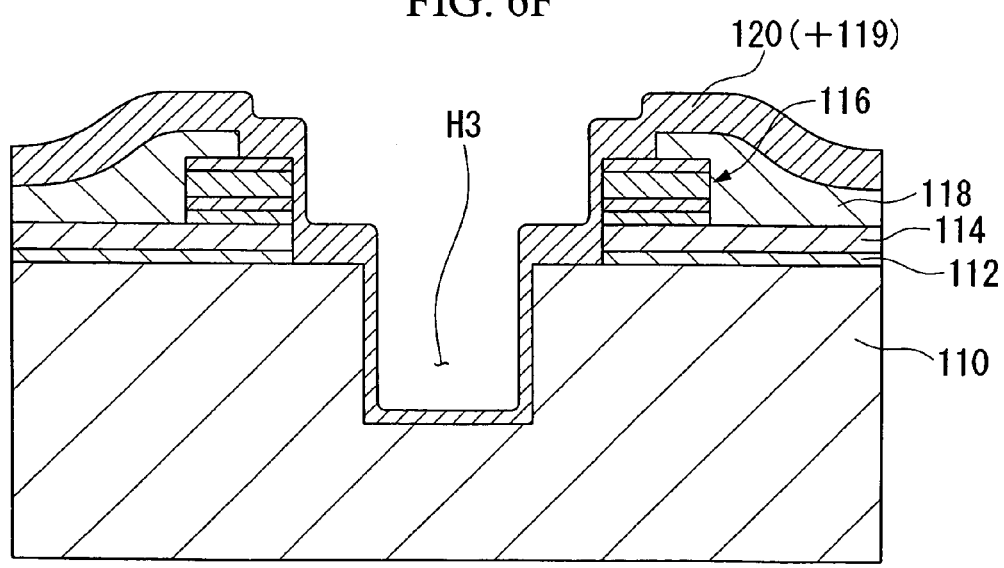

After the above-mentioned step is completed, a dielectric film 120 is formed on the passivation film 118 and on the inner wall and the bottom surface of the hole H3. FIG. 6F is a cross-sectional view of the substrate in which the dielectric film 120 has been formed on the electrode pads 116, and the inner wall and the bottom surface of the hole H3.

The dielectric film 120 is provided in order to prevent leak current and corrosion of the substrate 110 caused by oxygen and moisture, and may be made of tetraethoxysilane (referred to as TEOS hereinafter) deposited by means of plasma enhanced chemical vapor deposition (PECVD), i.e., made of PE-TEOS. The thickness of the dielectric film 120 may be, for example, about 2 µm. Instead of PE-TEOS, the dielectric film 120 may be made of TEOS ($O_3$-TEOS) deposited by means of ozone CVD, or may be made of silicon dioxide deposited by means of sputtering.

Next, a layer of resist (not shown) is formed on the entire surface of the passivation film 118 using conventional resist application method including spin coating, dipping and spray coating. Or dry film resist may be used. The resist is used for forming an opening on the electrode pad 116. The resist may be any type of resist, e.g., photoresist, electron beam resist, X-ray resist, and may be either positive or negative resist.

After the resist is applied on the passivation film 118, the resist is pre-baked. The resist is patterned to a desired pattern so that a part of the surface of the electrode pad 116 is exposed (for example, in an annular shape concentrically around the hole H3) by exposure and development processes using a mask with a desired pattern formed thereon.

After the resist is patterned, the resist is post-baked. A part of the dielectric film 120 which covers the electrode pad 116 is etched so that a part of electrode pad 166 is exposed. As a etching technique, dry etching is preferably used. More specifically, reactive ion etching is preferably used. Alternatively, wet etching technique may be used.

During this etching process, the fourth layer 116d included in the electrode pad 116 is also removed.

Figure 6G:
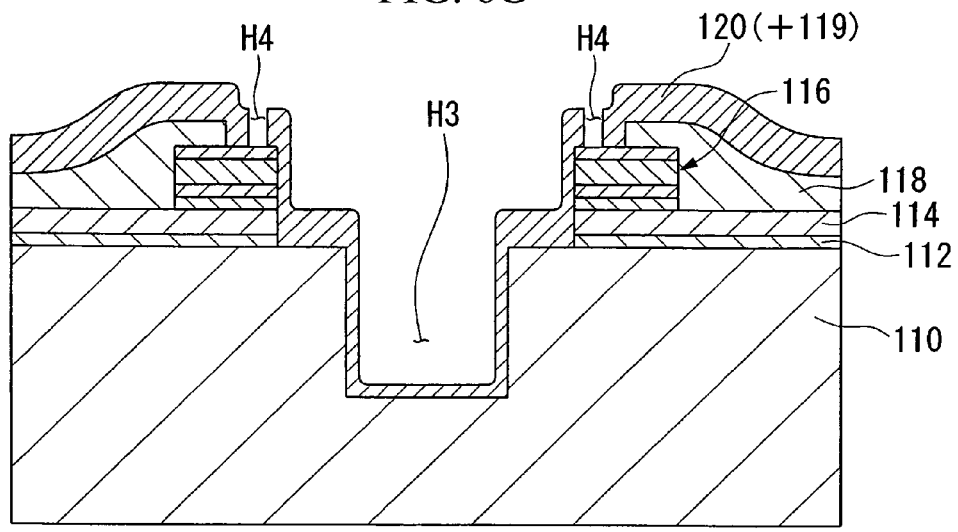

FIG. 6G is a cross-sectional view of the substrate in which a part of the dielectric film 120 which covers the electrode pad 116 has been removed. As shown in FIG. 6G, an annular opening H4 having an outer diameter of 80 µm and an inner diameter of 70 µm has been formed on the electrode pad 116, and parts of the electrode pad 116 have been exposed. This opening H4 allows connection between connecting terminal (electrode) which is to be formed in the step described below and the electrode pad 116. Accordingly, the opening H4 may be formed any position on the electrode pad 116, except the area in which the hole H3 is formed. The opening H4 may be adjacent to the hole H3.

In this example, the hole H3 has been formed substantially at the center of the electrode pad 116. Therefore, the opening H4 is preferably formed around the hole H3 to make a larger area of the electrode pad 116 exposed so that coupling resistance between the electrode pad 116 and the connecting terminal which will be formed later is reduced. The hole H3 may be formed off the center of the electrode pad, and a plurality of holes may be formed on the electrode pad. After removing a part of the dielectric film 120 which covers the electrode pad 116, the resist used in the etching step is removed with remover.

After the above-mentioned step is completed, an underlying film 122 is formed on the exposed surface of the electrode pad 116 and the inner wall and the bottom surface of the hole H3. The underlying film 122 includes a barrier layer and a seed layer, and formed by depositing the barrier layer first, and then the seed layer on the barrier layer. The barrier layer may be made of Ti and TiN, and the seed layer may be made of copper, for example.

The barrier layer and the seed layer may be formed by means of, for example, physical vapor deposition (PVD), such as ion metal plasma (IMP), vacuum evaporation, sputtering, or ion plating. The barrier layer and the seed layer are deposited on the whole surface of the wafer, and then unnecessary portions will be removed eventually.

Figure 6H:
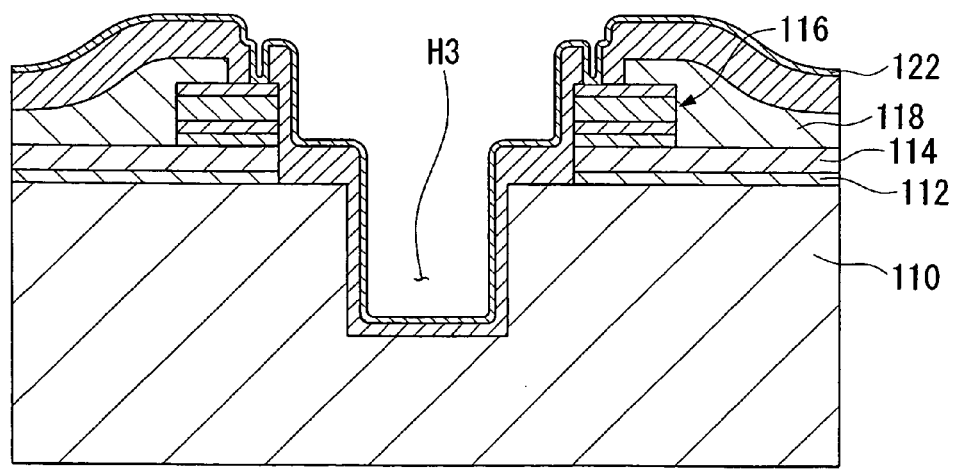

FIG. 6H is a cross-sectional view of the substrate in which the underlying film 122 has been formed. The thickness of the barrier layer included in the underlying film 122 may be, for example, about 0.1 µm, and the thickness of the seed layer may be, for example, about 0.3 µm. As used herein, unnecessary portions mean, for example, the barrier layer and the seed layer formed on the passivation film 118, except the area above the electrode pad.

Once formation of the underlying film 122 is completed, a pattern is formed so that an area in which a connecting terminal is to be formed is exposed with an inner diameter of 120 µm, and the rest of the area is covered with the resist. The patterning step using the resist is the same as the conventional patterning process. The resist used in this step has high resistance to plating which will be carried out in the next step, and the resist layer is formed to a thickness equal to or higher than the height of the post electrode. Next, copper is plated on the inner surface of the hole H3 and the surface of the electrode pad 116 by means of electrochemical plating (ECP) so that the hole H3 is filled with copper, and a metal layer which protrudes from the electrode pad 116 is formed as a post electrode 124 to height of about 10 µm. With the process steps described above, the post electrode 124 which is electrically connected to the electrode pad 116, and acts as an outer electrode at the front side of the substrate 110, has been formed in the above-described semiconductor chip. Lead-free solder (not shown), for example, solder made of SnAg, is disposed on the post electrode 124.

Figure 6I:
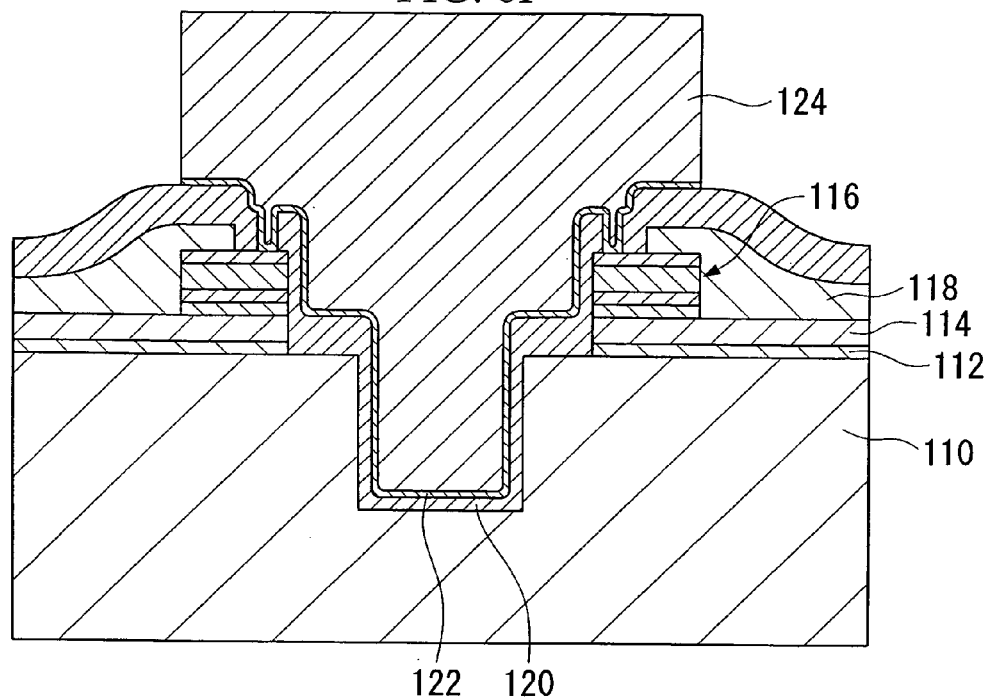

Next, the structure shown in FIG. 6I is obtained after the resist is stripped, and the unnecessary portions of the barrier layer and the seed layer (not shown) are etched. In general, the seed layer is etched with a wet etching technique using a suitable etching liquid. The barrier layer may be etched with a wet etching process, or a dry etching technique such as RIE. In order to protect the post electrode 124 from being etched, the etching process may be carried out after coating the post electrode 124 with resist.

Figure 6J:
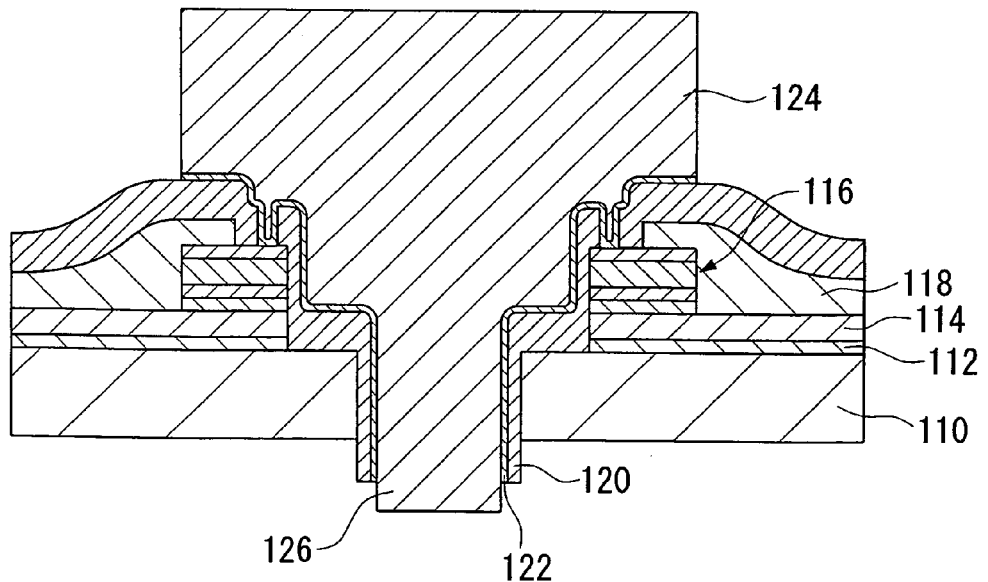

Then, the back side of the substrate 110 is stripped up to the point at which the thickness of the substrate 110 is about 50 µm, for example, and copper (trans-substrate conductive plug) filled in the hole H3 is exposed at the back side of the substrate. The resultant trans-substrate conductive plug which extends from the post electrode 124 protrudes from the back side of the substrate 110. The stripping of the substrate may be carried out by means of mechanical polishing or chemical etching, dry or wet etching, or combination thereof. Furthermore, the dielectric and the underlying layers 120 and 122 which are at the end of the metal portion protruding from the back side of the substrate 110 are removed by means of mechanical polishing, or wet or dry etching, or the like, and a trans-substrate conductive plug 126 which is electrically connected to the post electrode 124 is obtained, as shown in FIG. 6J.

Semiconductor chips having the post and trans-substrate conductive plugs 124 and 126 are obtained by separating the chips by means of dicing.

Next, the structure of trans-substrate and post electrodes of the intermediate chips in the semiconductor devices 140, 150, and 160 will now be explained based on a manufacturing method therefor. In this example, an intermediate chip having a single-layer structure as the one shown in FIG. 1 will be explained.

Figure 7A:
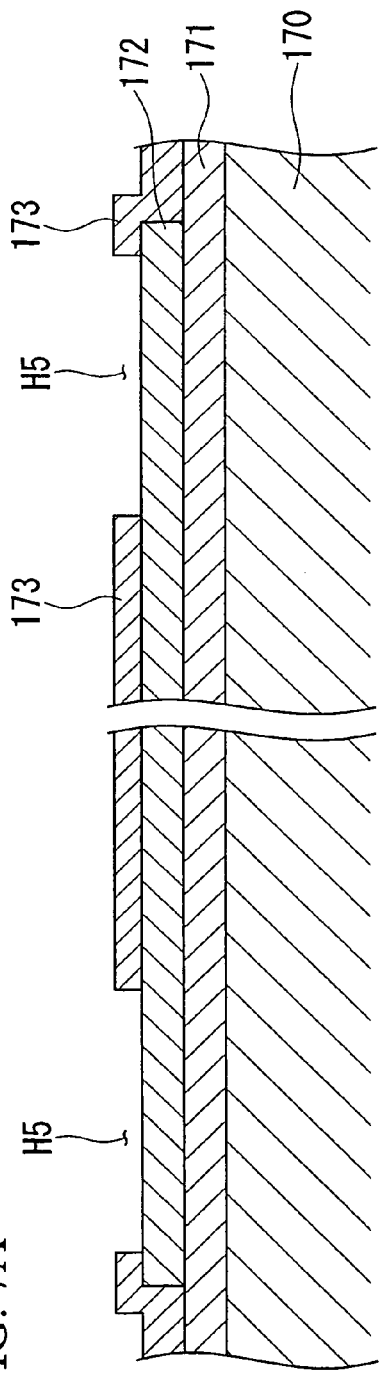

First, a substrate 170 made of silicon is provided as illustrated in FIG. 7A. Unlike the silicon substrate 110 described above, no integrated circuit having various elements has been formed on the substrate 170 in this example. Since this intermediate chip is manufactured separately from semiconductor chips, the yield of this intermediate chip does not affect the yield of the semiconductor chips.

An oxide film 171 made of thermal oxide or $SiO_2$ by means of plasma TEOS is deposited to a thickness of about 1 µm on either side or both sides, and lateral sides of the substrate 170. Then, a conductive pattern 172 which is used as a redistribution layer is formed at a predetermined position on the oxide film 171. The conductive pattern 172 is formed, for example, by depositing a first layer made of titanium (Ti) and a second layer made of aluminum (Al) in this order, and then patterning the conductive layer into a desired pattern.

A passivation film 173 which covers the conductive pattern 172 and is made of $SiO_2$ or SiN is formed, then the passivation film 173 is patterned to form openings in the passivation film in areas in which a post electrode and trans-substrate conductive plugs are to be formed.

FIG. 7A is a cross-sectional view of the substrate in which two openings are formed in the passivation film. The passivation film can be omitted, and the passivation formation step mentioned above may be omitted to proceed to the next step.

Next, the passivation film is coated with resist (not shown), and an opening having a smaller diameter than one of the openings which has been formed in the passivation layer, for example, of 60°µm, is formed by etching the conductive pattern 172 and the dielectric film 171 thereunder by means of dry etching. This results in the formation of an opening H6.

Next, after removing the resist using remover, an oxide film 174 which is made of $SiO_2$ and will be used as a mask is formed, for example, by means of plasma TEOS.

The etching mask is coated with resist (not shown), and an opening H7 having the same diameter as a trans-substrate conductive plug which is to be formed is formed in the inner region of the periphery of the opening H6 by means of photolithography and etching processes. The resist is then removed by remover.

Figure 7B:
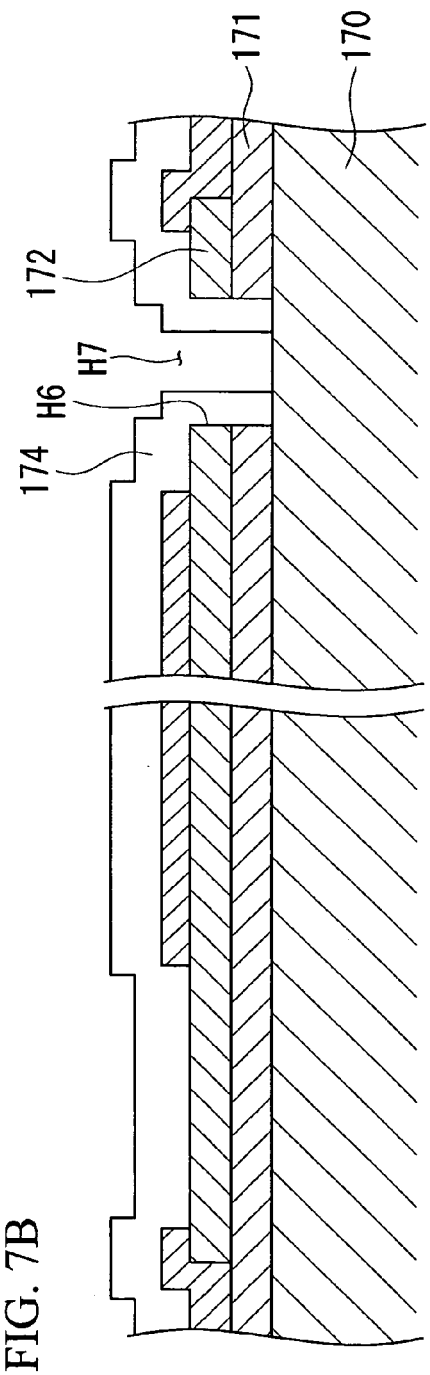

FIG. 7B is a cross-sectional view of the substrate in which the opening H7 has been formed after the conductive pattern 172 and the dielectric film 171 have been etched, and the oxide film 174 made of $SiO_2$ has been deposited as an etching mask.

The substrate 170 is etched by means of a dry etching process, e.g., RIE, by using the etching mask 174 as a mask.

Figure 7C:
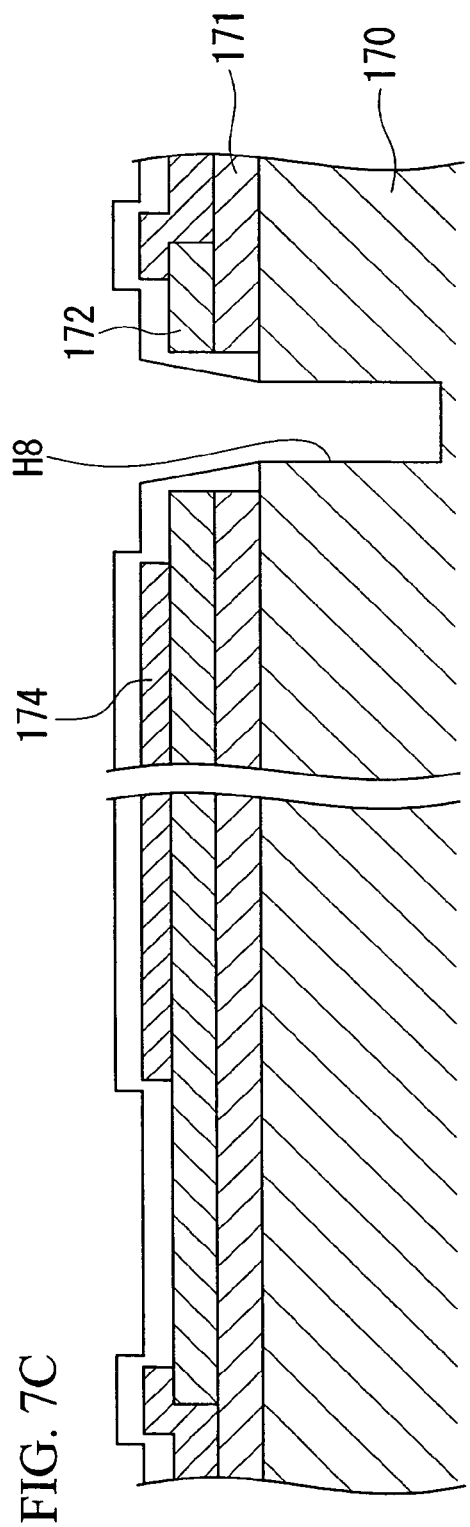

In this step, inductively coupled plasma (ICP) etching may be used instead of RIE. FIG. 7C is a cross-sectional view of the substrate in which the hole H3 has been formed by etching the substrate 170. It is understood that the depth of the hole H8 is selected according to the final thickness of the semiconductor chip. The depth of the hole H8 may be about 70 µm, for example.

The etching mask 174 is slowly etched during the etching step. Upon completion of formation of the hole H4, the etching mask 174 is almost completely removed.

Figure 7D:
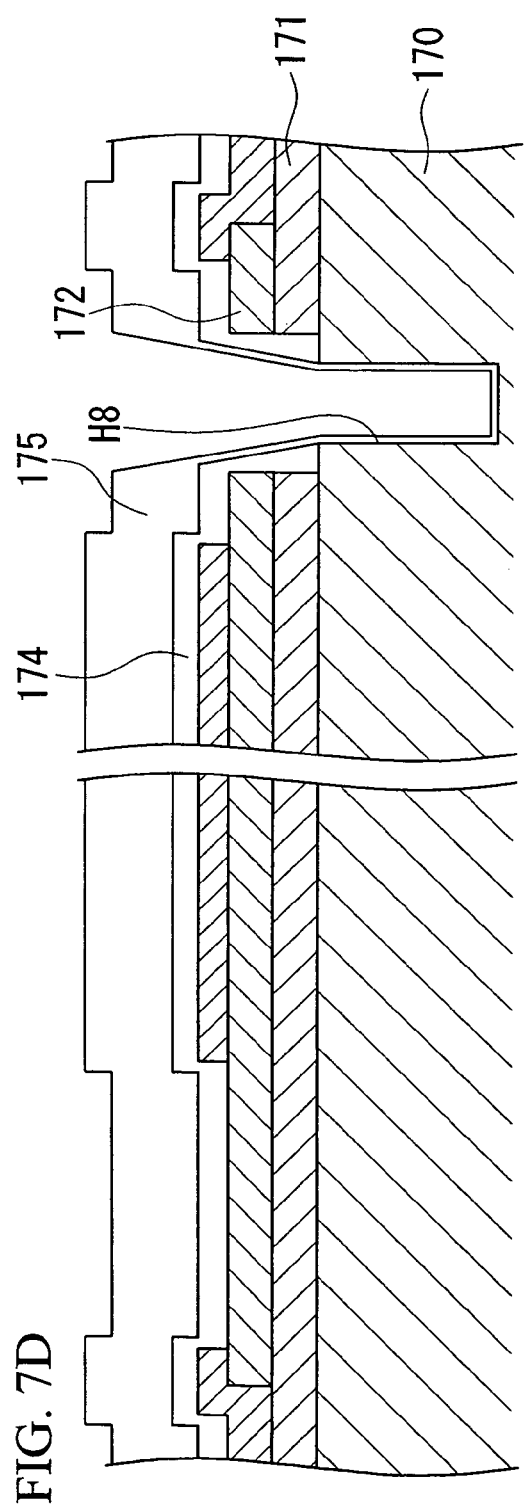

Next, a dielectric film 175 which is made of $SiO_2$ or SiN, or a stacked layer of $SiO_2$ and SiN is deposited on the oxide film 174, and the inner wall and the bottom surface of the hole H8, as shown FIG. 7D.

The dielectric film 175 is provided in order to prevent leak current and corrosion of the substrate 110 caused by oxygen and moisture, and may be made of tetraethoxysilane (referred to as TEOS hereinafter) deposited by means of plasma enhanced chemical vapor deposition (PECVD), i.e., PE-TEOS. The thickness of the dielectric film 175 may be, for example, about 2 µm. Instead of PE-TEOS, the dielectric film 175 may be made of TEOS ($O_3$-TEOS) deposited by means of ozone CVD, or may be made of silicon dioxide deposited by means of sputtering.

Next, a resist layer (not shown) is formed, and the resist is patterned to a desired pattern by exposure and development processes. An annular opening H9 is formed around hole H8, and an opening H10 is formed in a position in which a post electrode is to be formed by etching the dielectric film 175 using the resist having the desired pattern, as shown in FIG. 7E. Both the openings H9 and H10 are formed by etching the dielectric film 175 by means of dry etching until the conductive pattern 172 is exposed at the bottom of the resultant openings H9 and H10. The resist is then removed by remover.

An underlying film 176 is then formed on the exposed portions of the conductive pattern 172 (including the inner walls of openings H9 and H10), as well as on the inner wall and the bottom surface of the hole H8, as shown in FIG. 7F. Similar to the underlying film 122, the underlying film 122 includes a barrier and seed layers. The barrier layer may be made of Ti and TiN, and the seed layer may be made of copper, for example. The barrier layer and the seed layer may be formed by means of, for example, physical vapor deposition (PVD), such as ion metal plasma (IMP), vacuum evaporation, sputtering, or ion plating. The barrier layer and the seed layer are deposited on the whole surface of the wafer, and then unnecessary portions will be removed eventually.

A resist pattern is formed so that an area surrounded by the openings H8 and H9, and the opening H10 are exposed. The inner surface of the holes H8 and H9, and the inside the opening H 10 is plated by means of electrochemical plating (ECP). The resist used in this step has high resistance to plating which will be carried out in the next step is used, and the resist layer is formed to a thickness equal to or higher than the height of the post electrode. With the process steps described above, the hole H8 and the opening H9 are filled with conductive material, e.g., copper, as shown in FIG. 7G At the same time, the opening H10 is filled with conductive material, e.g., copper, in order to form a post electrode. The plating for filling the hole H8 and the opening H9, the plating for filling the opening H10 may be carried out separately. In this case, a material used for-plating which exhibits an excellent filling property is preferably filled into the hole H8 and the opening H9, and a material having a good leveling property is preferably filled into the opening H10.

The copper which is filled into the hole H8 and the opening H9 forms a trans-substrate conductive plug 177, and copper which is filled into the opening H10 forms a post electrode 178. Furthermore, the conductive pattern 172 which connects the trans-substrate and post electrode 177 and 178 forms wiring 179. Lead-free solder (not shown), for example, solder made of SnAg, is disposed on the post electrode 178.

Next, the resist is stripped, and the unnecessary portions of the barrier layer and the seed layer (not shown) are etched. In general, the seed layer is etched with a wet etching technique using a suitable etching liquid. The barrier layer may be etched with a wet etching process, or a dry etching technique such as RIE. In order to protect the post electrode 178 from being etched, the etching process may be carried out after coating the post electrode 124 with resist.

Then, the back side of the substrate 170 is stripped up to the point at which the trans-substrate conductive plug 177 is exposed at the back side of the substrate for forming a protrusion. The stripping of the substrate may be carried out by means of mechanical polishing or chemical etching, or combination thereof. Furthermore, the dielectric and the underlying layers 175 and 176 which are at the end of the metal portion protruding from the back side of the substrate 170 is removed by means of mechanical polishing, or etching, or the like, and a trans-substrate conductive plug 177 which is electrically connected to the post electrode 178 is obtained, as shown in FIG. 7H.

Intermediate chips having the trans-substrate conductive plugs 177, the post electrodes 178, and the wiring 179 for coupling the trans-substrate conductive plug and the post electrode 177 and 178 are obtained by separating the chips with a dicing process.

A semiconductor device shown in FIGS. 3 and 4 is formed by stacking semiconductor chips and intermediate chips manufactured by the methods mentioned above and attaching an end of a trans-substrate conductive plug and a surface of a post electrode together.

Next, an example of a circuit board and an electronic device which include the semiconductor device 140 mentioned above will be explained.

Figure 8:
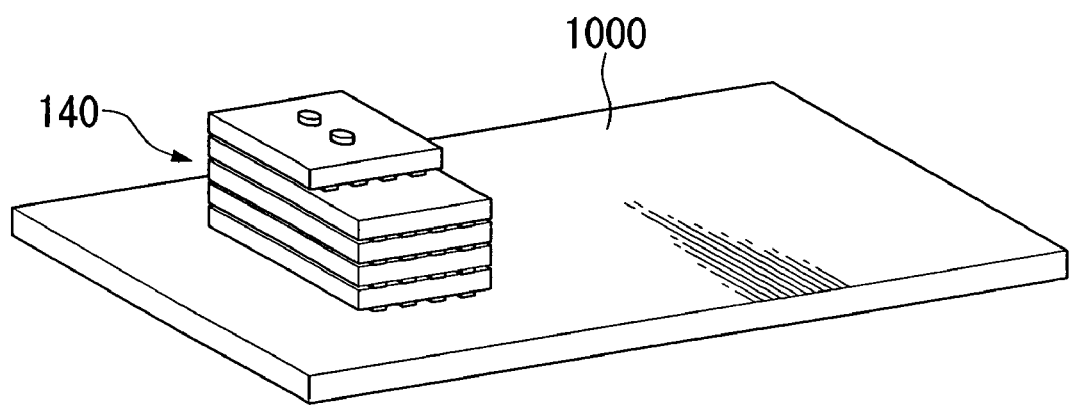
FIG. 8 is a schematic drawing illustrating one embodiment of a circuit board according to the first aspect of the present invention.

FIG. 8 is a schematic perspective view of a circuit board according to an embodiment of the present invention. As shown in FIG. 8, the semiconductor device 140 which has been described above is mounted on a circuit board 1000 according to this embodiment.

Although the semiconductor device 140 is usually mounted on the circuit board 1000 after the semiconductor device 140 has been stacked and packaged, a semiconductor device which has already been stacked before packaging may be mounted. A package is omitted in FIG. 8 so that how the semiconductor device is mounted on circuit board is illustrated clearly.

The circuit board 1000 includes an organic substrate, for example, glass epoxy resin substrate. Wiring pattern (not shown) made of, for example, copper, is formed to define a desired pattern on the substrate, and electrode pads (not shown) are connected to the wiring pattern. The electrical pads are connected to the trans-substrate conductive plugs 144 of the first semiconductor chip 141 included in the semiconductor device 140, and the semiconductor device 140 is mounted on the circuit board 1000.

In the circuit board 1000 having the configuration described above, high packaging density is realized. Since a redistribution layer is available in the semiconductor device 140, the size and weight of the circuit board can be reduced, and reliability of wire bonding is enhanced.

Figure 9:
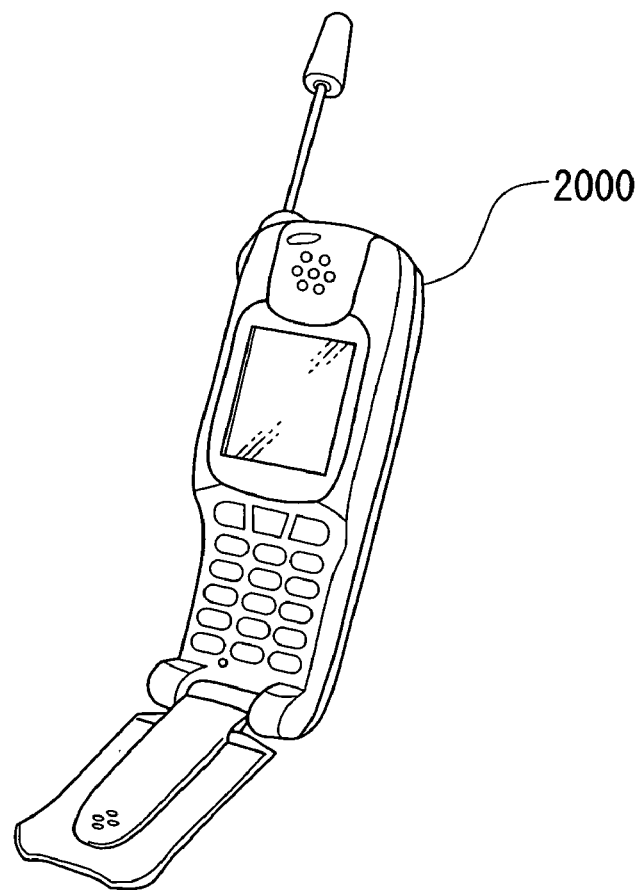
FIG. 9 is a schematic drawing of one embodiment of the electronic device according to the first aspect of the present invention.

FIG. 9 is a schematic perspective view of a portable telephone as one embodiment of an electronic device according to the present invention. As shown in FIG. 9, a portable telephone 2000 includes the semiconductor device 140 or the circuit board 1000 described above inside a casing thereof.

In the portable telephone 2000 (electronic device) having the configuration described above, high packaging density is realized. Since a redistribution layer is available in the semiconductor device 140, the size and weight of the circuit board can be reduced, and reliability of wire bonding is enhanced.

Electronic devices of the present invention are not limited to the above-mentioned portable telephones, but may include a wide variety of electronic devices. Non-limiting examples of electronic devices of the present invention includes: notebook computers, liquid crystal projectors, multimedia-ready personal computers (PCs) and engineering workstations (EWSs), pagers, word processors, television sets, viewfinder-type or direct viewing monitor-type video cassette recorders (VCRs), electronic organizers, electronic desk calculators, car navigation systems, POS terminals, and devices having touch panels and the like.

Second Embodiment

An embodiment of an intermediate chip module according to the second aspect of the present invention will be explained based on a manufacturing method thereof. First, manufacturing steps for manufacturing a semiconductor chip (semiconductor wafer) which is included an intermediate chip module will be explained with reference to schematic diagrams of FIGS. 10A–C.

Figure 10A:
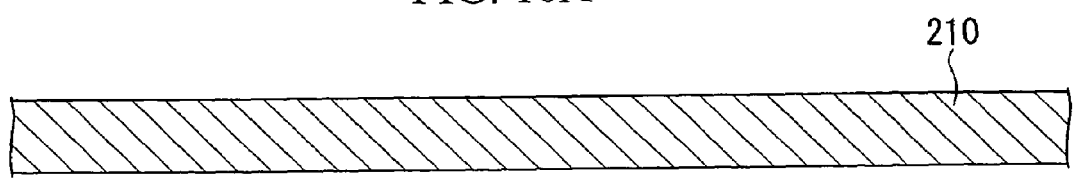
FIGS. 10A–C are schematic diagrams illustrating an example of steps for manufacturing a semiconductor chip according to the second aspect of the present invention.

As shown in FIG. 10A, a silicon substrate (wafer) 210, a base material for forming a semiconductor chip, is provided. Although various components and circuits, such as transistors and memory elements, are formed on the front side (active side) of the silicon substrate 210, they are not shown in this figure.

Figure 10B:
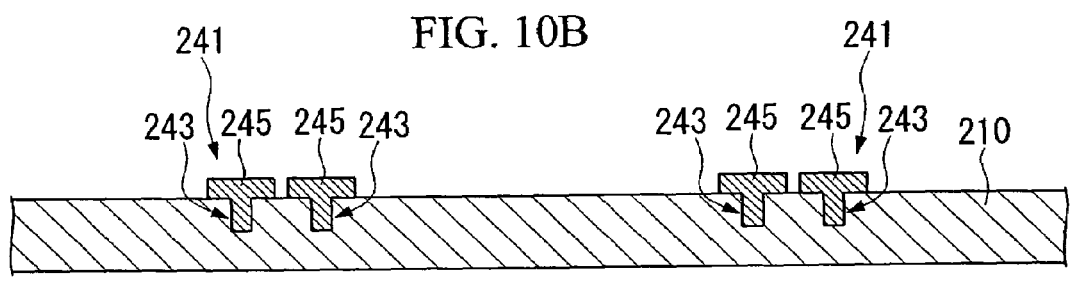

Next, openings are formed at predetermined positions on the front side of the silicon substrate 210. Conductive material, e.g., copper, is filled into the openings and electrodes 243 which will be formed into trans-substrate conductive plugs in a later step are formed, as shown in FIG. 10B. The silicon substrate 210 and the electrodes 243 are insulated from each other via a dielectric film. The electrodes 243 are provided separately from the various elements and circuits, and function as connecting members used for three-dimensional packaging. Post electrodes 245 are formed on the active side (front side) of the silicon substrate 210 on which elements and circuits are formed so that the post electrodes 245 which are parts of the electrodes 243 protrude from the active side. The electrodes 243 including the post electrodes 245 are connected to the those elements and circuits.

Figure 10C:
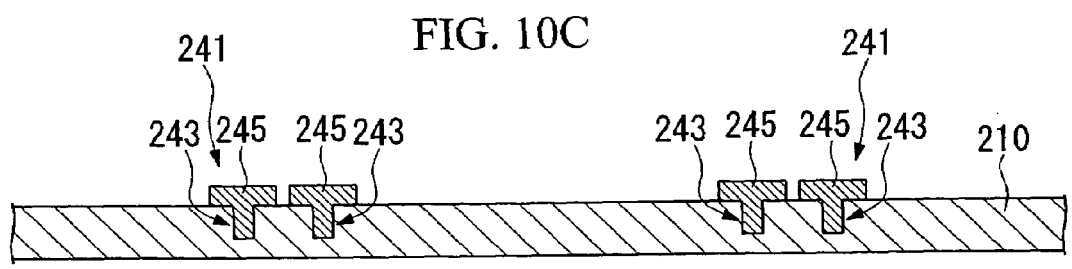

The silicon substrate 210 is reduced in thickness according to requirements as shown in FIG. 10C.

The electrodes 243 have been provided corresponding to a plurality of semiconductor chips which has been formed on the silicon substrate 210. In the example shown in FIGS. 10A–C, two semiconductor chips 241 has been formed on the silicon substrate 210, and two electrodes 243 are formed for each of the two semiconductor chips 241.

Next, processing steps for forming an intermediate chip included in an intermediate chip module will be explained briefly with reference to schematic diagrams of FIGS. 11A–E. As used herein, an "intermediate chip" refers to a chip which electrically connects semiconductor chips.

Figure 11A:
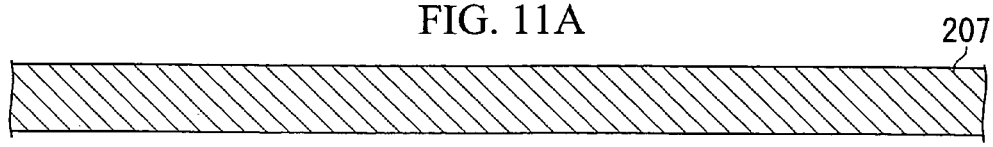
FIGS. 11A–E are schematic diagrams illustrating an example of steps for manufacturing an intermediate chip, according to the second aspect of the present invention.

As shown in FIG. 11A, a silicon substrate (wafer) 207, a base material for forming an intermediate chip, is provided. A dielectric film (not shown) has been formed on the front side of the silicon substrate 207.

Figure 11B:
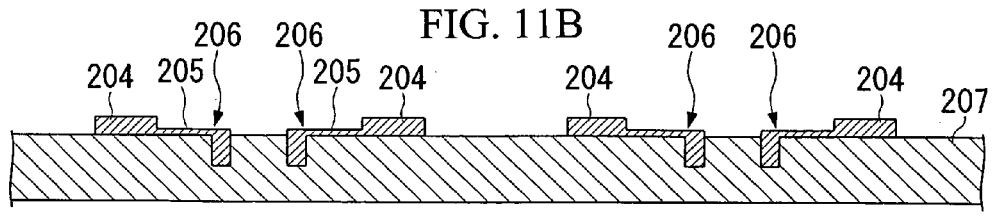

Next, openings are formed at predetermined positions on the front side of the silicon substrate 207. Conductive material, e.g., copper, is filled into the openings and electrodes 206 which will be formed into trans-substrate conductive plugs in a later step are formed, as shown in FIG. 11B The electrodes 206 include post electrodes 204 which are provided on the front side of the silicon substrate 207, and are electrically connected to electrodes filled into openings (i.e., trans-substrate conductive plug 203 which will be described later) via wiring 205. The silicon substrate 207 and the electrodes 206 are also insulated from each other via a dielectric film, in this example.

Figure 11C:
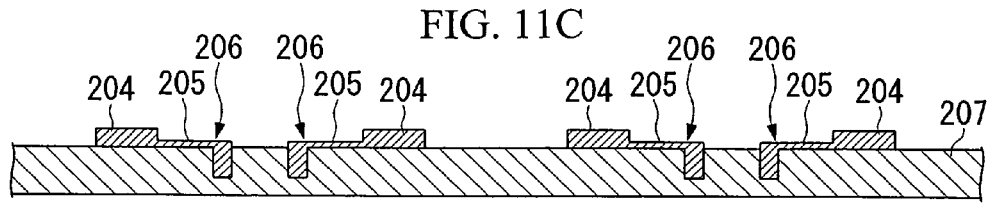
Figure 11D:
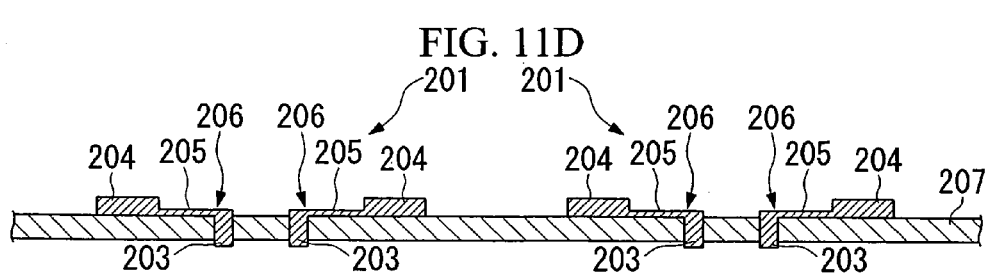

The silicon substrate 207 is reduced in thickness as shown in FIG. 11C. In addition, the thickness of the silicon substrate 207 is reduced (the back side of the silicon substrate 207 are stripped) to reduce the thickness of the silicon substrate 207 as shown in FIG. 11D so that parts of the conductive material of the electrodes 206 filled into the silicon substrate are exposed from the back side of the silicon substrate 207 and trans-substrate conductive plugs (first terminals) 203 are formed. As described above, the post electrodes 204 which are provided on the front side of the silicon substrate 207 and the trans-substrate conductive plugs 203 are electrically connected to each other via the wiring 205.

In this step, after making the trans-substrate conductive plugs 203 protrude, a dielectric film is formed on the back side of the substrate 207, i.e., the side to which the trans-substrate conductive plugs 203 are exposed, and then only the end portions of the trans-substrate conductive plugs 203 are exposed, which is not shown in this figure. In other words, the entire back side of the substrate except for areas in which electrodes for electrical connection are formed are covered with the dielectric film. Methods for stripping the substrate in order to expose the electrodes include dry etching and polishing, and combination thereof.

The electrodes 206 are provided corresponding to a plurality of intermediate chips which have been formed on the silicon substrate 207. In the example shown in FIGS. 11A–E, two intermediate chips 201 has been formed on the silicon substrate 207, and two electrodes 201 are formed for each of the two intermediate chips 206.

Figure 11E:
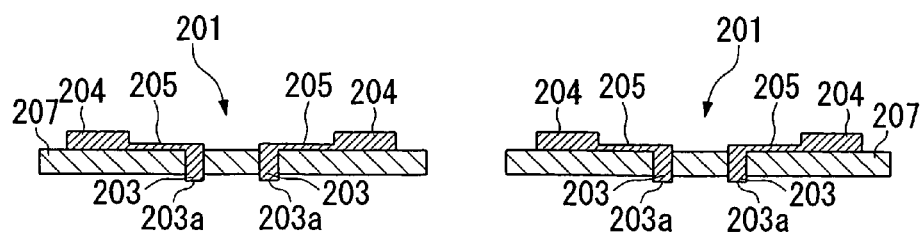

Next, as shown in FIG. 11E, the silicon substrate 207 are cut (diced) into respective chips according to the intermediate chips 201. In the steps mentioned above, a plurality of intermediate chips which are capable of electrically connecting semiconductor chips are obtained from a single silicon substrate 207.

It should be understood that the trans-substrate conductive plugs 203 may protrude from the front side of the silicon substrate 207, and the post electrodes 204 may be provided on the back side of the silicon substrate 207.

In the present embodiment, a trans-substrate conductive plug 203 is formed to penetrate through the silicon substrate 207 so that one end of the trans-substrate conductive plug 203 protrudes from the back side of the silicon substrate 207 and the other end of the trans-substrate conductive plug 203 is exposed to the front side of the silicon substrate 207. Although the post electrodes 204 and the protrusions 203a of the trans-substrate conductive plugs 203 are displaced from each other in plan view, they may be positioned at the same position. The wiring 205 is disposed on the front surface of the silicon substrate 207, and it extends between the other end of the trans-substrate conductive plug 203 and the post electrode 204 so that they are coupled to each other. Having this structure, the intermediate chip 201 allows a redistribution layer from the protrusion 203a of the trans-substrate conductive plug 203 to the post electrode 204.

An intermediate chip 201 shown in FIGS. 11A–E has a plurality of (two) sets of the trans-substrate conductive plug 203, the post electrode 204 and the wiring 205. Thus, a single intermediate chip 201 can provide connection across terminals of a plurality of (two) sets of semiconductor chips, which will be described later. Although specifically not shown in FIGS. 11A–E, single wiring 205 may couple between a plurality of the trans-substrate conductive plugs 203 and one post electrode 204, or conversely, one wiring 205 may couple to one trans-substrate conductive plug 203 and a plurality of the post electrodes 204. Furthermore, one wiring may couple to a plurality of the trans-substrate conductive plugs 203 and one post electrode 204. In this configuration, electrical connection between one or more electrodes of one semiconductor chip and one or more electrodes of another semiconductor chip is achieved only by this connecting intermediate chip 201. In addition, if a dielectric film on the back side of the intermediate chip 201 has been formed beforehand, the resultant dielectric film functions as an intermediate layer when the chips are stacked and electrical insulation between a semiconductor chip 241 and an intermediate chip 201 is achieved, as will be explained later.

Next, steps for attaching the semiconductor chip (semiconductor wafer) 241 formed by the steps which have been described referring to FIGS. 10A–C and the intermediate chip 201 formed by the steps which have just been described referring to FIGS. 11A–E will be explained with reference to FIGS. 12A–D.

Figure 12A:
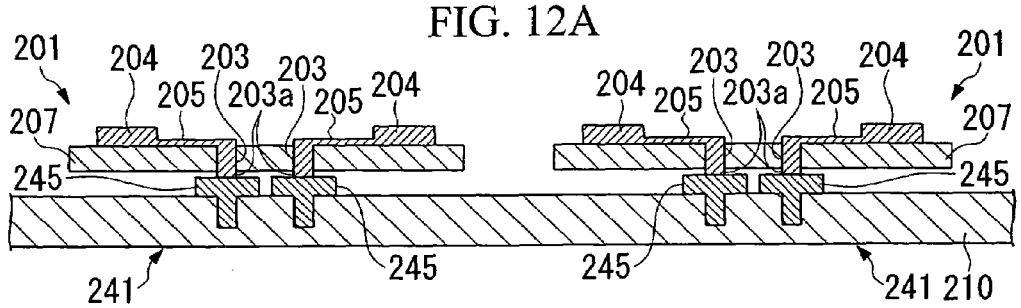
FIGS. 12A–D are schematic diagrams illustrating an example of steps for manufacturing an intermediate chip module according to the second aspect of the present invention.

As shown in FIG. 12A, a plurality of intermediate chips 201 are connected to a silicon substrate 210 which includes plurality of semiconductor chips 241. In the present embodiment, the intermediate chips 201 are placed (stacked) on the semiconductor chip 241. While aligning the intermediate chips 201 with respect to the semiconductor chip 241, protrusions (first terminals) 203a of trans-substrate conductive plugs 203 of the intermediate chips 201 and post electrodes 245 of the semiconductor chips 241 and 242 are electrically connected, for example, via lead-free solder. The lead-free solder has been disposed on at least one of the protrusions 203a of the trans-substrate conductive plugs 203 and the post electrodes 245 beforehand, and the intermediate chips 201 and the semiconductor chip 241 are heated together to couple the trans-substrate conductive plugs 203 and the post electrodes 245 together by heat by means of reflow soldering.

Underfill material 208 is filled as intermediate layers between the silicon substrates 207 of the intermediate chips 201 and the silicon substrate 210 of the semiconductor chip

Figure 12B:
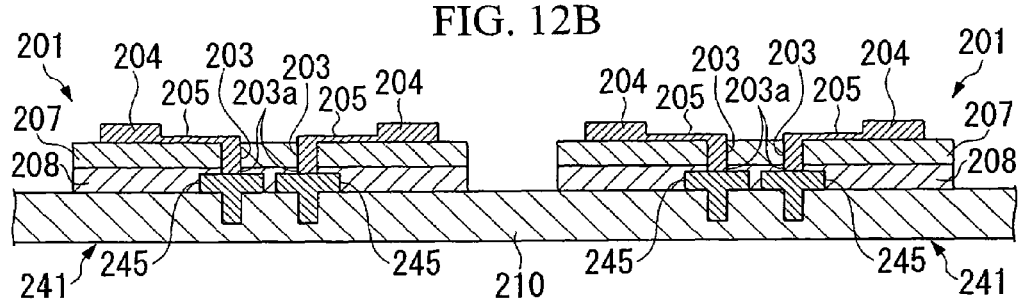

241, as shown in FIG. 12B. The filled underfill material 208 is then cured. This enhances the strength of the stacked body as a whole including the semiconductors chip 241 and the intermediate chips 201. In this example, the chips are insulated from each other by providing dielectric films as intermediate layers; thus problems, e.g., short circuit, can be prevented.

Figure 12C:
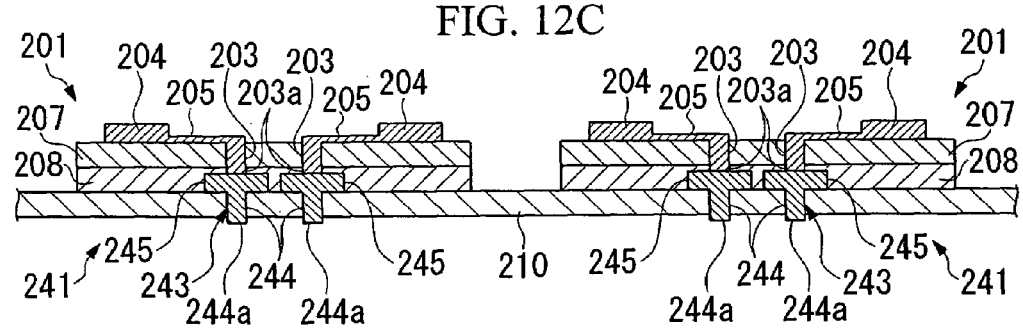

Once the intermediate chips 201 and the semiconductor chips 241 are connected to each other, the back side of the silicon substrate 210 is stripped, as shown in FIG. 12C so that parts of the conductive material of the electrodes 243 filled in the silicon substrate 210 are exposed from the back side of the silicon substrate 210 and trans-substrate conductive plugs 244 are formed. The post electrodes 245 provided on the front side of the silicon substrate 210 and the trans-substrate conductive plugs 244 are electrically connected to each other.

In this step, after making the trans-substrate conductive plugs 244 protrude, a dielectric film is formed on the back side of the substrate 210, i.e., the side to which the trans-substrate conductive plugs 244 are exposed, and then only the end portions of the trans-substrate conductive plugs 244 are exposed, which is not shown in this figure. In other words, all of the back side of the substrate except for areas in which electrodes for electrical connection are formed are covered with the dielectric film. Methods for stripping the substrate in order to expose the electrodes include dry etching and polishing, and combination thereof.

Figure 12D:
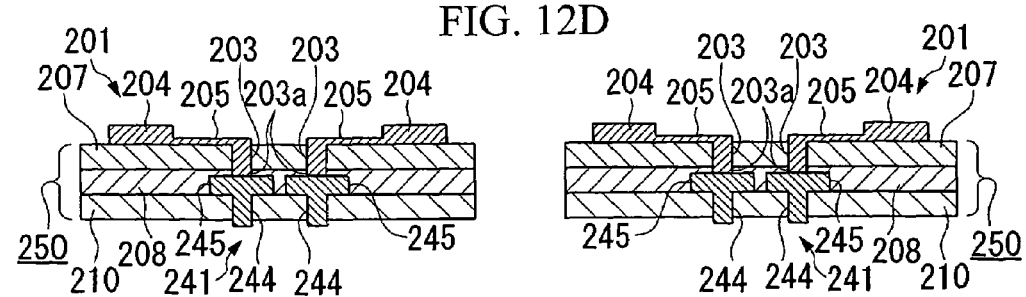

After connecting a plurality of intermediate chips 201 to the silicon substrate 210 having the plurality of semiconductor chips 241 in the manner described above, the silicon substrate 210 is cut (diced) to the size of the intermediate chips 201 into separate chips (stacked bodies). In the steps described above, intermediate chip modules 250 which have been formed into a single body by attaching the intermediate chips 201 and the semiconductor chips 241 have been formed, as shown in FIG. 12D. In this example, since the intermediate chips 201 are disposed to the active side of the semiconductor chip 241, elements and circuits which are provided on the active side of the semiconductor chip 241 are protected by the intermediate chips 201.

In the method mentioned above, intermediate chips which have been formed on a substrate are diced after the intermediate chips are stacked on the semiconductor chips (semiconductor wafer). Alternatively, after making respective terminals (electrodes) of semiconductor chips and intermediate chips exposed, and dicing the semiconductor chips and intermediate chips, they may be coupled to form a structure shown in FIG. 12D.

Since the intermediate chip modules 250 are formed by attaching the intermediate chips 201 and the semiconductor chips 241 into a single body, handling of chips becomes easier. In addition, since underfill material 208 is filled as an intermediate layer between the intermediate chip 201 and the semiconductor chip 241, the strength of the stacked body including the intermediate chip, the semiconductor chip, and stacked body including the underfill material is enhanced. Furthermore, since bending of the chip is reduced, stacking the chips becomes easier.

Next, processing steps for making packages (primary packaging) by mounting intermediate chip modules 250 is manufactured with the processing steps mentioned above on a substrate PB (e.g., a substrate made from epoxy resin, glass epoxy resin, ceramics, glass, or silicon) which is used for various packages will be explained with reference to FIGS. 13A and 13B. In this example, a ceramic substrate is used as the substrate PB, on which solder balls which are to be used as connecting members for secondary packaging have been formed in advance according to requirement. The solder balls form, for example, a BGA (ball grid array).

Figure 13A:
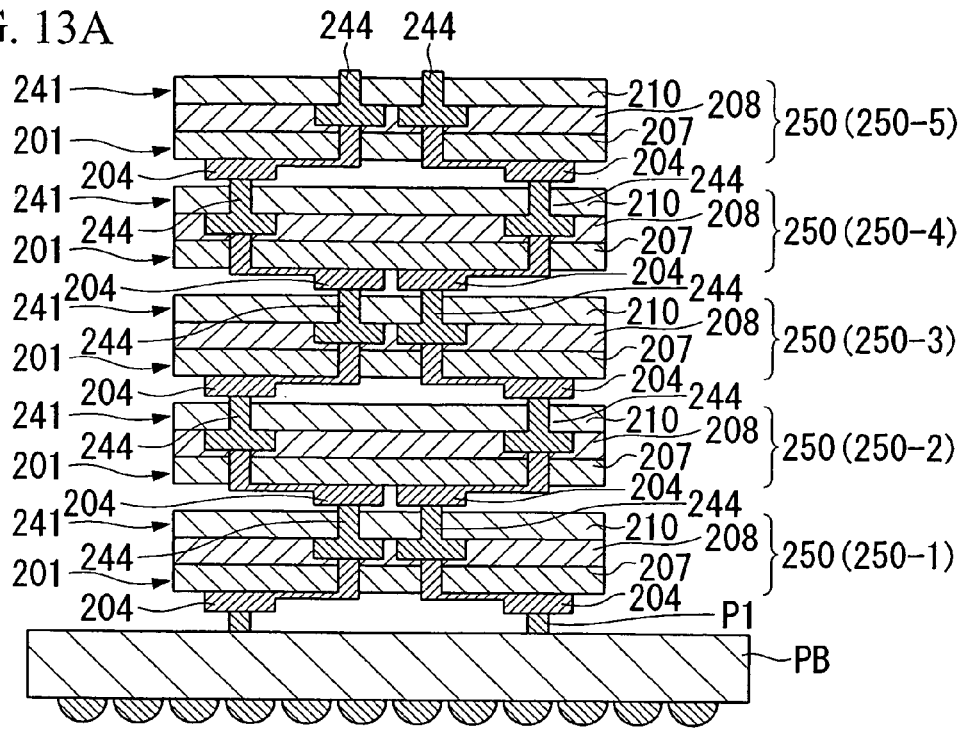
FIGS. 13A and B are schematic diagrams illustrating an example of chip stacking processes according to the second aspect of the present invention.

As shown in FIG. 13A, a plurality of intermediate chip modules 250 are formed on the substrate PB to form a stacked body consisting of the intermediate chip modules 250. In this example, five intermediate chip modules 250-1, 250-2, 250-3, 250-4 and 250-5 are stacked in this order.

In the example shown in FIG. 13A, electrodes are provided at different positions than the position of the electrodes of the intermediate chip modules 250 shown in FIG. 12D in some of the intermediate chip modules 250. In addition, the intermediate chip modules 250 are stacked upside down. That is, in the embodiment shown in FIGS. 13A and 13B, two kinds of intermediate chip modules 250 are stacked alternately.

Trans-substrate conductive plugs 244 of a semiconductor chip 241 included in a first intermediate chip module 250 (for example, 250-1) of the stacked intermediate chip modules 250 are electrically connected to post electrodes 204 of the intermediate chip 201 included in a second intermediate chip module 250-2 which is arranged adjacent to the first intermediate chip module 250-1. In this embodiment, while aligning the next intermediate chip module 250-2 with respect to the intermediate chip module 250 (for example, 250-1) which has been placed on the substrate PB beforehand, the trans-substrate conductive plugs 244 of the intermediate chip module 250-1 placed on the substrate PB and the post electrodes 204 of a next intermediate chip module 250 (for example, 250-2) are electrically connected via lead-free solder. The post electrodes 204 of the bottommost intermediate chip module 250-1 are electrically connected to terminals P1 of the substrate PB via lead-free solder. The lead-free solder has been disposed on at least one of protrusions 244a of trans-substrate conductive plugs 244 and the post electrodes 204. After a predetermined number of (five) intermediate chip modules 250-1 to 250-5 are stacked, the intermediate chip modules 250-1 to 250-5 are heated together to couple the trans-substrate conductive plugs 244 and the post electrodes 204 by means of reflow soldering. In this manner, the stacked body including the intermediate chip modules 250-1 to 250-5 is formed on the substrate PB. Since the intermediate chip modules 250 having the similar structures are stacked in this embodiment, the semiconductor chips 241 and the intermediate chips 201 are stacked alternately. It should be understood that when stacking intermediate chip modules, the intermediate chip modules may be coupled together with a temporary bond, and then permanently connected by means of reflow soldering.

The method for attaching is not limited to the reflow technique, but a pressurizing and heating method (e.g., flip chip bonding) may be used.

Other than stacking the intermediate chip modules 250-1 to 250-5, an intermediate chip 201 may be placed between any of the intermediate chip modules 250 (for example, between 250-5 and 250-3) so that the intermediate chip modules 250-2 and 250-3 are connected via this intermediate chip 201. Alternatively, a semiconductor chip 241 may be placed between any of the intermediate chip modules 250 (for example, between 250-3 and 250-4) to form the stacked body. In other word, a stacked body may be formed by stacking any combination of intermediate chips 201, semiconductor chip 241 and intermediate chip modules 250.

Figure 13B:
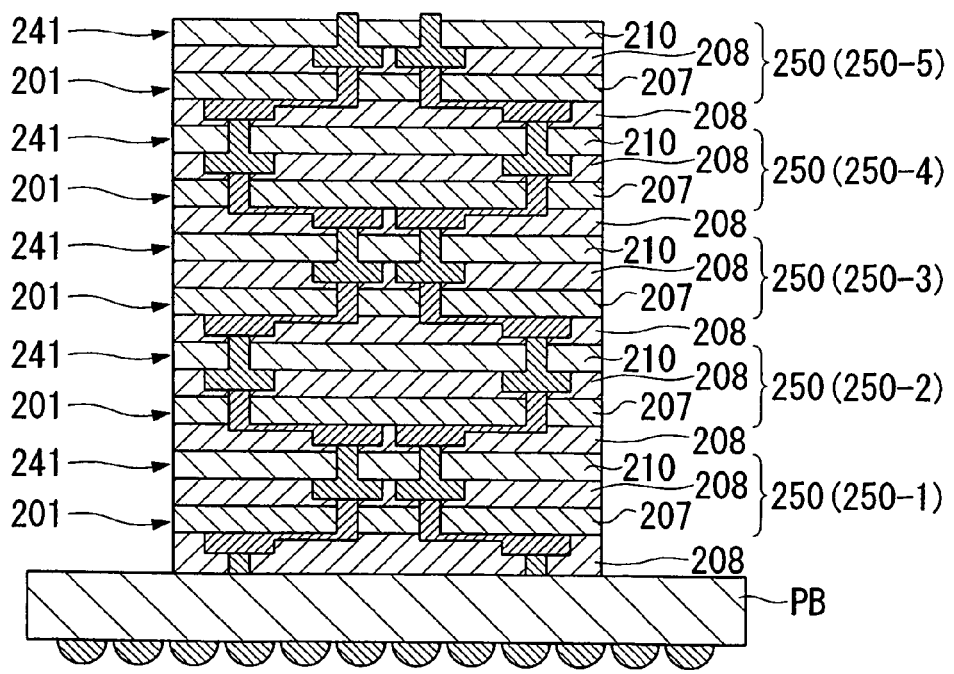

Then, underfill material 208 is filled as intermediate layers between the intermediate chip modules 250-1 to 250-5, and between the bottommost intermediate chip module 250-1 and the substrate PB, as shown in FIG. 13B. The filled underfill material 208 is then cured. This enhances the strength of the stacked body as a whole assembled from a plurality of chips.

Epoxy materials are generally used as the underfill material 208. When selecting a proper material, properties of material other than insulation performance, such as residual stress and modulus of elasticity after curing, should be taken into account.

Then the entire stacked body is molded to obtain a package of stacked intermediate chip modules.

In this embodiment, after stacking intermediate chip modules 250 on the substrate PB, the intermediate chip modules 250 are connected together with a temporary bond, and then permanently attached by means of reflow (bonding by heat application). Alternatively, for example, the step of placing an intermediate chip module 250 on the substrate PB (or on the top intermediate chip module 250 of one or more intermediate chip modules 250 which have been connected to the substrate PB) and the step of reflow (bonding by heat application) may be carried out alternately to stack intermediate chip modules 250 on the substrate PB. Alternatively, after forming a stacked body which includes intermediate chip modules 250 but not the substrate PB by means of reflow soldering, the resultant stacked body may be connected to the substrate PB. Alternatively, the stacked body may be formed with a pressurizing and heating method (e.g., flip chip bonding) other than the reflow method using the same the manufacturing steps described above. In this case, any combination of intermediate chips 201 and semiconductor chips 241 may be stacked.

As described above, since a module formed by connecting an intermediate chip 201 which is capable of electrically connecting a plurality of chips and the semiconductor chips 241, the strength of the chips are further enhanced, and problems, e.g., bending of or damage to the chips, can be prevented. Accordingly, decrease in yield is prevented, and handling of the chips becomes easier when chips are stacked three-dimensionally. Thus, various types of semiconductor devices can be formed with a simple step of stacking intermediate chip modules 250; thus flexibility in design and structure of three-dimensional stacked chips are enhanced. Accordingly, characteristics of such semiconductor devices, such as providing multiple functions, can be enhanced. Furthermore, the intermediate chip modules 250 having the intermediate chips 201 allows a redistribution layer between predetermined chips.

Since the underfill material 208 is disposed between the intermediate chips 201 and the semiconductor chips 241, problems, e.g., bending of or damage to the chips, can be prevented. In particular, when the intermediate chip module 250 is coupled to another chip or another intermediate chip module 250 or when the intermediate chip module 250 is packaged, bending of or damage to the chips can be prevented. Thus, by providing the underfill material 208 for reinforcing chips, handling of chips becomes easier and reduction in yield can be prevented. It should be understood that the underfill material (intermediate layer) may be provided between the intermediate chips 201 and the semiconductor chip 214 for purposes other than reinforcing chips, for example, for enhancing connecting strength between chips, for providing insulation between wiring in order to prevent short circuit, or for adjusting the overall height of the intermediate chip modules 250. Materials used for forming intermediate layers can be selected according to such purposes.

It should also be understood that gap material can be disposed as a material for forming the intermediate layer, in addition to dielectric materials (for example $SiO_2$ or SiN) and underfill materials (organic resins, e.g., epoxy resin) described earlier.

Figure 14A:
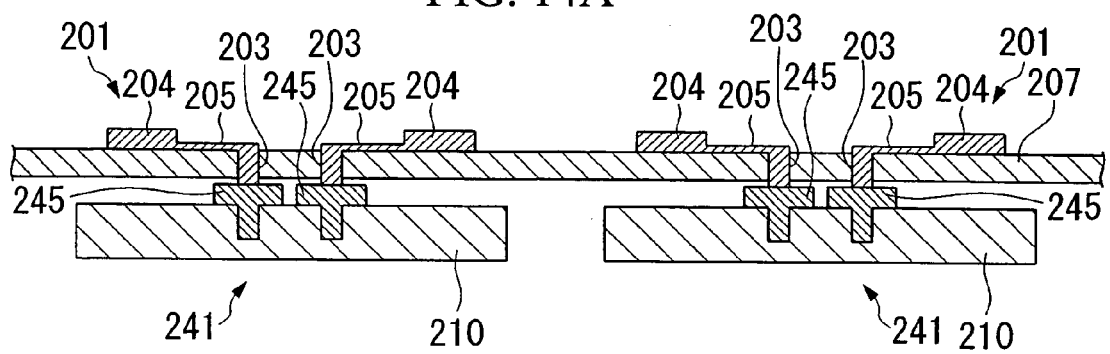
FIGS. 14A and B are schematic diagrams illustrating another example of steps for manufacturing an intermediate chip module according to the second aspect of the present invention.
Figure 14B:
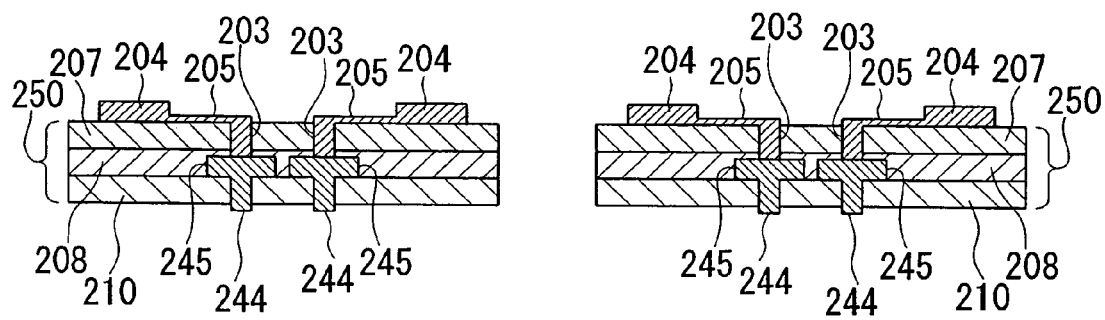

In the above-mentioned embodiment, after connecting a plurality of intermediate chips 201 to the silicon substrate 210 having multiple semiconductor chips 241, the silicon substrate 210 is cut (diced) according to the size of the intermediate chips 201 into separate chips (stacked bodies). However, a plurality of semiconductor chips 241 may be connected to the silicon substrate 207 having multiple semiconductor chips 241 as shown in FIG. 14A, and the silicon substrate 210 may be cut (diced) according to the size of the semiconductor chips 241 into separate chips (stacked bodies) as shown in FIG. 14B. In the example shown in FIG. 14A, the thickness of the silicon substrate 207 is reduced (part of the silicon substrate 207 is stripped) to make the trans-substrate conductive plugs 203 protrude from the back side of the silicon substrate 207, and then the post electrodes 245 of the semiconductors chip 241 are connected to the trans-substrate conductive plugs 203 in order to establish an electrical connection. Before or after the dicing step described above, the back sides of the silicon substrate 210 of the semiconductor chip 241 are reduced in thickness to make the trans-substrate conductive plug 244 protrude, and the underfill material 208 is filled between the silicon substrates 207 and the silicon substrates 210.

Figure 15A:
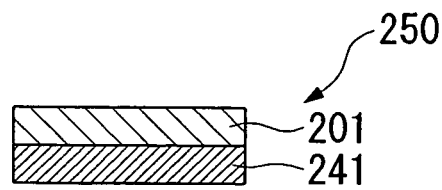
FIGS. 15A–D are schematic diagrams illustrating another embodiment of the intermediate chip module according to the second aspect of the present invention.
Figure 15B:
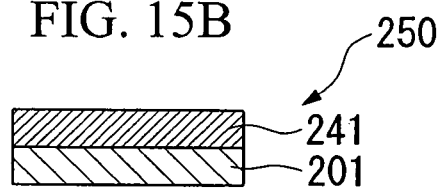
Figure 15C:
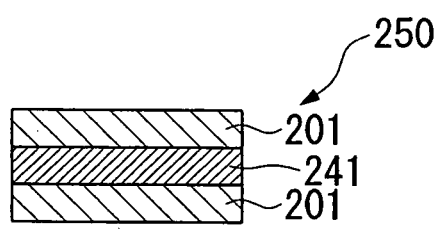
Figure 15D:
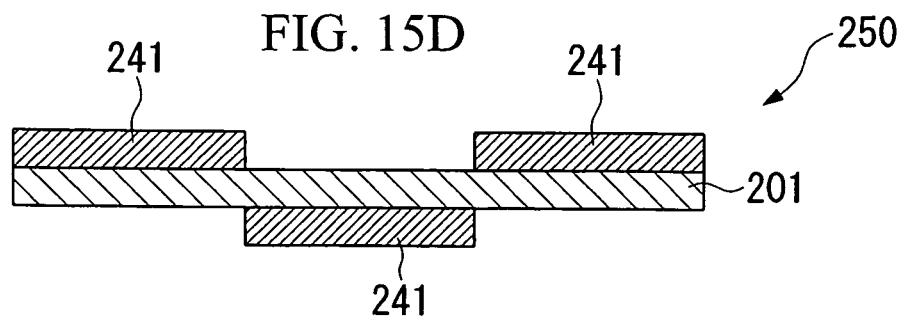

In the above-mentioned embodiment, it has been described that an intermediate chip module 250 is formed into a single body by attaching one intermediate chip 201 to the active side (front side) of the semiconductor chip 241, as shown in a schematic diagram of FIG. 15A. However, the intermediate chip module 250 may be formed by attaching an intermediate chip 201 to the back side of the semiconductor chip 241, as shown in a schematic diagram of FIG. 15B. Alternatively, as shown in FIG. 15C, intermediate chips 201 may be attached to both sides of the semiconductor chip 241 to sandwich the semiconductor chip 241 between the two intermediate chips 201, or one or more semiconductor chip 241 and one or more intermediate chip 201 may be stacked alternately. In other words, as long as an intermediate chip module 250 includes at least one intermediate chip 201 and at least one semiconductor chip 241, any combination of intermediate chip 201 and semiconductor chip 241 may be stacked. Furthermore, as shown in FIG. 15D, more than one semiconductor chip 241 may be attached to at least one side of a large intermediate chip 201 (for example, the intermediate chip (wafer) before dicing as shown in FIG. 11D). In the example shown in FIG. 15D, two semiconductor chips 241 are attached to the front side of the intermediate chips 201, and one semiconductor chip 241 is attached to the back side of the intermediate chips 201. The two semiconductor chips 241 attached to the front side of the intermediate chips 201 may be of different kinds, or may be of the same kind. A plurality of intermediate chips 201 may be attached to one side (or both sides) of the large semiconductor chip (wafer) 241.

In the embodiment shown in FIGS. 13A and 13B, different types of the intermediate chip module 250 having electrodes in different positions are stacked. However, as shown in FIGS. 15A–D, other types of intermediate chip module 250 may be manufactured. For example, the semiconductor chip 241 and the intermediate chips 201 may be stacked differently in the intermediate chip modules 250. Different types of semiconductor chip 241 and/or intermediate chip 201 (in terms of structure) may be stacked, or the different sizes and/or different combination of sizes of semiconductor chips 241 and/or intermediate chips 201 may be stacked the intermediate chip modules 250. Or the sizes of the intermediate chip module may be different. Any combination of such various intermediate chip modules 250 may be selected and stacked.

As described above, by manufacturing a variety of intermediate chip modules 250 and selecting any combination of such intermediate chip modules 250, semiconductor devices having various structures can be manufactured easily, and flexibility in design and structure can be enhanced.

It should be understood that the same type of intermediate chip module may be stacked together to form an intermediate chip module 250.

Figure 16A:
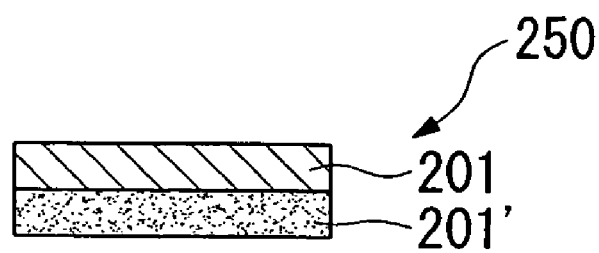
FIGS. 16A–C are schematic diagrams illustrating another embodiment of the intermediate chip module according to the second aspect of the present invention.
Figure 16B:
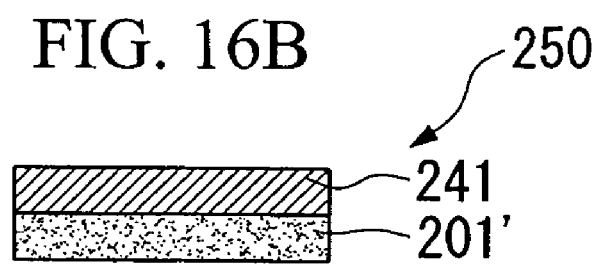
Figure 16C:
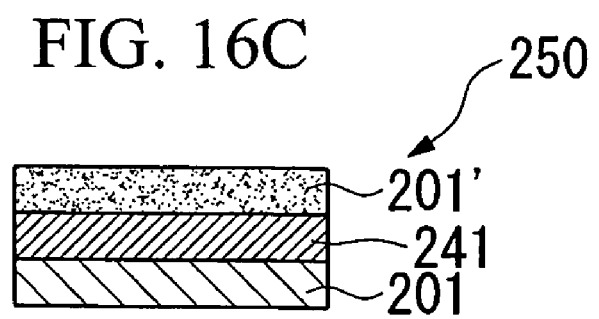

FIGS. 16A–C are schematic diagrams of intermediate chip modules 250 including intermediate chips 201' having passive elements.

In other words, the intermediate chip module 250 may include passive elements, such as a resistor element or a capacitor. By allowing each of the intermediate chip and the semiconductor chip to electrically connect to the passive elements, chips can be connected via the passive elements; thus flexibility of design and structure of semiconductor devices can be further enhanced.

FIG. 16A is a schematic diagram of the intermediate chip module 250 in which an intermediate chip 201 without passive element and an intermediate chip 201' having passive element are stacked. As shown in this figure, the intermediate chip module 250 may be formed into a single body by attaching the intermediate chip 201 to the intermediate chip 201' having passive elements. The intermediate chip module 250 may be formed by stacking a plurality of intermediate chips 201 without passive element or by stacking a plurality of intermediate chips 201' having passive elements. Although the back side of the intermediate chip 201 and the front side of the intermediate chips 201' are attached together in the example shown in FIG. 16A, the front side of the intermediate chip 201 and the back side of the intermediate chips 201' may be attached. Furthermore, the intermediate chip module 250 may be formed into a single body by attaching a plurality of intermediate chips 201 and one intermediate chip 201', or attaching one intermediate chip 201 and a plurality of intermediate chips 201', or attaching a plurality of intermediate chips 201 and a plurality of intermediate chips 201'.

FIG. 16B is a schematic diagram of the intermediate chip module 250 in which a semiconductor chip 241 and the intermediate chip 201' having passive elements are stacked. The intermediate chip module 250 may be formed into a single body by attaching the semiconductor chip 241 and the intermediate chip 201'. Although the back side of the semiconductor chip 241 and the front side of the intermediate chip 201' are attached in the example shown in FIG. 16B, the front side of the semiconductor chip 241 and the back side of the intermediate chips 201' may be attached. Furthermore, the intermediate chip module 250 may be formed into a single body by attached a plurality of semiconductor chips 241 and one intermediate chip 201', or attached one semiconductor chip 241 and a plurality of intermediate chips 201', or attached a plurality of semiconductor chips 241 and a plurality of intermediate chips 201'.

FIG. 16C is a schematic diagram of the intermediate chip module 250 in which an intermediate chip 201, a semiconductor chip 241 and an intermediate chip 201' having passive elements are stacked. As shown in this figure, the intermediate chip module 250 may be formed into a single body by attaching the intermediate chip 201, the semiconductor chip 241 and the intermediate chip 201'. It should be understood that although intermediate chips 201, the semiconductor chips 241 and the intermediate chips 201' are stacked in this order, this order is not limited to the particular order shown in FIG. 16C, and they may be stacked in any order. Furthermore, other than the intermediate chip module 250 having one intermediate chips 201 one semiconductor chip 241, and one intermediate chip 201', the intermediate chip module 250 may be formed into a single body by stacking any number of the intermediate chip 201, the semiconductor chip 241, and the intermediate chip 201' in any combination.

In the embodiments shown in FIGS. 16A–C, passive elements may be provided on the front side or the back side of the intermediate chip 201', or may be provided on both sides of the intermediate chip 201'. Therefore, various types of intermediate chip modules 250 can be manufactured easily. By selecting and connecting desired intermediate chip modules from these intermediate chip modules, various types of semiconductor devices having various structures can be easily manufactured.

In the embodiments mentioned above, different types of passive element may be provided to the intermediate chips 201'. For example, when passive elements are provided on both the front and back sides of an intermediate chip 201', a first passive element provided on the front surface and a second passive element provided on the back side may be of different kinds. Alternatively, when a plurality of passive elements are provided on either the front size or the back side of the intermediate chip, the plurality of passive elements may be of different kinds. Thus, various types of intermediate chip modules 250 can be manufactured easily, and flexibility of design and structure of semiconductor devices can be further enhanced since manufacturing semiconductor devices are manufactured by selecting intermediate chips 250 from various intermediate chips and combining them.

As described above, since the post electrodes 204 of the intermediate chips 201 and the trans-substrate conductive plugs 203 are displaced from each other in plan view by means of wiring 250, the wiring 205 extends to a desired position so that a redistribution layer between semiconductor chips 241 and intermediate chip modules 250 becomes possible. It should be understood that a plurality of wirings may be provided to the intermediate chips 201, and different sets of wires may be crossed together in plan view.

Both substrates 207 and 210, which are base materials of an intermediate chip and a semiconductor chip, are made of silicon, thermal expansion coefficients of the two substrates become equal to each other. Accordingly, problems caused by difference in thermal expansion coefficient between the intermediate chips 201 and the semiconductor chips 241, such as peel-off of connecting members or crack, can be prevented.

By using the silicon substrates 207 and 210 which have substantially the same thickness, the substrate can be standardized; thus reduction in manufacturing costs can be attained. Furthermore, since most of chips have almost the same thickness, the height of a semiconductor device made by stacking the chips is roughly dependent on the number of stacked chips; thus design of electronic devices having these semiconductor devices can be standardized. The method for manufacturing the trans-substrate conductive plugs of semiconductor chips and intermediate chips has been described above.

Next, an example of a circuit board and an electronic device which include the semiconductor device 140 mentioned above will now be explained.

FIG. 8 is a schematic perspective view of a circuit board according to an embodiment of the present invention. As shown in FIG. 8, the semiconductor device 140 which has been described above is mounted on a circuit board 1000 according to this embodiment. Although the semiconductor device 140 is usually mounted on the circuit board 1000 after the semiconductor device 140 has been stacked and packaged, a semiconductor device which has already been stacked before packaging may be mounted. A package is omitted in FIG. 8 so that how the semiconductor device is mounted on circuit board is illustrated clearly.

The circuit board 1000 includes an organic substrate, for example, glass epoxy resin substrate. Wiring pattern (not shown) made of, for example, copper, is formed to define a desired pattern on the substrate, and electrode pads (not shown) are connected to the wiring pattern. The electrical pads are connected to the trans-substrate conductive plugs 244 of the first semiconductor chip 141 included in the semiconductor device 241, and the semiconductor device 140 is mounted on the circuit board 1000.

In the circuit board 1000 having the configuration described above, high packaging density is realized. Since a redistribution layer is available in the semiconductor device 140, the size and weight of the circuit board can be reduced, and reliability of wire bonding is enhanced.

FIG. 9 is a schematic perspective view of a portable telephone as one embodiment of an electronic device according to the second embodiment of the present invention. As shown in FIG. 9, a portable telephone 2000 includes the semiconductor device 140 or the circuit board 1000 according to the present invention inside a casing thereof.

In the portable telephone 2000 (electronic device) having the configuration described above, high packaging density is realized. Since a redistribution layer is available in the semiconductor device 202, the size and weight of the circuit board can be reduced, and reliability of wire bonding is enhanced.

Electronic devices of the present invention are not limited to the above-mentioned portable telephones, but may include a wide variety of electronic devices. Non-limiting examples of electronic devices of the present invention includes: notebook computers, liquid crystal projectors, multimedia-ready personal computers (PCs) and engineering workstations (EWSs), pagers, word processors, television sets, viewfinder-type or direct viewing monitor-type video cassette recorders (VCRs), electronic organizers, electronic desk calculators, car navigation systems, POS terminals, and devices having touch panels and the like.

While preferred embodiments of the invention have been described and illustrated above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An intermediate chip for electrically connecting semiconductor chips, comprising:
   a substrate having a first side and a second side; a trans-substrate conductive plug which projects to the first side of the substrate;
   a post electrode which is displaced from the trans-substrate conductive plug in plan view on second side of the substrate; and
   wiring which is disposed in or on the substrate for coupling the trans-substrate conductive plug and the post electrode.

2. The intermediate chip according to claim 1, wherein the substrate is made of silicon.

3. The intermediate chip according to claim 1, wherein a plurality of sets of the trans-substrate conductive plug, the post electrode and the wiring for coupling the trans-substrate conductive plug and the post electrode are provided.

4. The intermediate chip according to claim 3, wherein different sets of the wiring are crossed together in plan view.

5. The intermediate chip according to claim 1, wherein a plurality of trans-substrate conductive plugs is coupled to single wiring.

6. The intermediate chip according to claim 1, wherein a plurality of post electrodes is coupled to single wiring.

7. The intermediate chip according to claim 1, wherein at least one of the trans-substrate conductive plug, the post electrode, and the wiring preferably is made of copper.

8. A semiconductor device comprising:
   a first semiconductor chip having a first trans-substrate conductive plug;
   a second semiconductor chip having a second trans-substrate conductive plug, the second trans-substrate conductive plug being displaced from the first trans-substrate conductive plug in plan view; and
   an intermediate chip having a third trans-substrate conductive plug, a post electrode, and wiring, the post electrode being displaced from the third trans-substrate conductive plug, the wiring connecting the third trans-substrate conductive plug and the post electrode,
   wherein the third trans-substrate conductive plug and the first trans-substrate conductive plug of the first semiconductor chip are connected at one side of the intermediate chip, and the post electrode which is connected to the third trans-substrate conductive plug via the wiring and the second semiconductor chip of the second trans-substrate conductive plug are connected at the other side of the intermediate chip.

9. The semiconductor device according to claim 8, wherein a plurality of the intermediate chips are stacked together, and respective electrodes of each chip are coupled.

10. The semiconductor device according to claim 8, wherein the first and second semiconductor chips are different kinds of chips.

11. The semiconductor device according to claim 8, wherein the intermediate chip has substantially the same thickness as one of the first and second semiconductor chips.

12. A circuit board on which the semiconductor device according to claim 8 is mounted.

13. An electronic device comprising the semiconductor device according to claim 8.

14. The semiconductor device according to claim 8, wherein an intermediate layer is provided between the intermediate chip and at least one of the first and second semiconductor chips.

15. The semiconductor device according to claim 14, wherein a layer which includes at least a dielectric film is provided as the intermediate layer.

16. The semiconductor device according to claim 8, wherein the intermediate chip comprises at least one passive element.

17. The semiconductor device according to claim 16, wherein the at least one passive element is provided on at least one of the front size and the second side of the intermediate chip.

18. The semiconductor device according to claim 16, wherein the intermediate chip comprises a plurality of the passive elements which are of different kinds.

19. A semiconductor device comprising:
a stacked body, wherein the stacked body comprises a plurality of intermediate chip modules stacked together, and each of the intermediate chip modules comprises:
an intermediate chip comprising:
a substrate having a first side and a second side;
a trans-substrate conductive plug which projects to at least the first side of the substrate:
a post electrode which is displaced from the trans-substrate conductive plug in plan view on the second side of the substrate: and
wiring which is disposed in or on the substrate for coupling the trans-substrate conductive plug and the post electrode; and
a semiconductor chip, wherein the semiconductor chip and the intermediate chip are bonded together.

20. The semiconductor device according to claim 19, wherein the plurality of intermediate chip modules are of the same kind.

21. The semiconductor device according to claim 19, wherein the plurality of intermediate chip modules are of different kinds.

22. A circuit board on which the semiconductor device according to claim 19 is mounted.

23. An electronic device comprising the semiconductor device according to claim 19.

24. The intermediate chip according to claim 1, wherein the trans-substrate conductive plug also projects to the second side of the substrate.

* * * * *